United States Patent
Hook et al.

(10) Patent No.: US 10,128,377 B2
(45) Date of Patent: Nov. 13, 2018

(54) INDEPENDENT GATE FINFET WITH BACKSIDE GATE CONTACT

(71) Applicant: INTERNATIONAL BUSINESS MACHINES CORPORATION, Armonk, NY (US)

(72) Inventors: Terence B. Hook, Jericho, VT (US); Joshua M. Rubin, Albany, NY (US); Tenko Yamashita, Schenectady, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/441,941

(22) Filed: Feb. 24, 2017

(65) Prior Publication Data
US 2018/0248041 A1 Aug. 30, 2018

(51) Int. Cl.
*H01L 29/78* (2006.01)
*H01L 23/522* (2006.01)
(Continued)

(52) U.S. Cl.
CPC .. *H01L 29/7855* (2013.01); *H01L 21/823431* (2013.01); *H01L 21/823475* (2013.01);
(Continued)

(58) Field of Classification Search
CPC ..... H01L 21/823425; H01L 21/823821; H01L 27/0886; H01L 27/0924; H01L 27/10826;
(Continued)

(56) References Cited

U.S. PATENT DOCUMENTS

| 6,611,002 B2 | 8/2003 | Weeks et al. |
| 7,192,876 B2 | 3/2007 | Matthew et al. |

(Continued)

FOREIGN PATENT DOCUMENTS

| KR | 1020070019681 A | 2/2007 |
| KR | 100906282 B1 | 6/2009 |

OTHER PUBLICATIONS

Cui et al., "Layout Characterization and Power Density Analysis for Shorted-Gate and Independent-Gate 7nm FinFET Standard Cells," GLSVLSI' 15, (May 20-22, 2015), ACM, Jul. 15, 2005, pp. 1-6.
(Continued)

*Primary Examiner* — Moin Rahman
(74) *Attorney, Agent, or Firm* — Cantor Colburn LLP; Vazken Alexanian

(57) ABSTRACT

A method of making a semiconductor device includes forming a plurality of fins on a substrate, with the substrate including an oxide layer arranged beneath the plurality of fins. A sacrificial gate material is deposited on and around the plurality of fins. First trenches are formed in the sacrificial gate material. The first trenches extend through the oxide layer to a top surface of the substrate and are arranged between fins of the plurality of fin. First trenches are filled with a metal gate stack. Second trenches are formed in the sacrificial gate material, with a bottom surface of the second trenches being arranged over a bottom surface of the first trenches, and the second trenches being arranged between fins of the plurality of fins and alternating with the first trenches. The second trenches are filled with a metal gate stack.

13 Claims, 25 Drawing Sheets

(51) Int. Cl.
*H01L 23/535* (2006.01)
*H01L 21/8234* (2006.01)

(52) U.S. Cl.
CPC ........ *H01L 23/5226* (2013.01); *H01L 23/535* (2013.01); *H01L 2029/7858* (2013.01)

(58) Field of Classification Search
CPC ........... H01L 27/10879; H01L 27/1211; H01L 29/41791; H01L 29/66772; H01L 29/66795; H01L 29/7831; H01L 29/785; H01L 29/786; H01L 2029/785; H01L 2029/7858; H01L 2029/786; H01L 2924/13067
USPC ....... 257/401, 283, 347, 301, 349, 410, 384, 257/368, 288, 369, 57, 76, 327; 438/283, 438/151, 478, 481, 455, 197, 149, 187, 438/270, 268, 156, 599
See application file for complete search history.

(56) References Cited

U.S. PATENT DOCUMENTS

| | | | |
|---|---|---|---|
| 7,288,805 B2 | 10/2007 | Anderson et al. | |
| 7,491,594 B2 | 2/2009 | Dao | |
| 7,537,985 B2 | 5/2009 | Anderson et al. | |
| 8,203,182 B2 | 6/2012 | Muller et al. | |
| 9,214,529 B2 | 12/2015 | Chang et al. | |
| 2013/0065371 A1* | 3/2013 | Wei | H01L 21/76224 438/294 |
| 2014/0252489 A1 | 9/2014 | Yu et al. | |
| 2015/0079773 A1* | 3/2015 | Basker | H01L 21/18 438/510 |
| 2016/0190312 A1 | 6/2016 | Zhang et al. | |

OTHER PUBLICATIONS

Maly, et al., "Twin Gate, Vertical Slit FET (VeSFET) for Highly Periodic Layout and 3D Integration," Department of Microelectronics & Computer Science, Technical University of Lodz, MIXDES 2011, 18th International Conference "Mixed Design of Integrated Circuits and Systems", Jun. 16-18, 2011, Gliwice, Poland, 2011, pp. 145-150.

List of IBM Patents or Patent Applications Treated as Related; (Appendix P), Filed Apr. 20, 2018; 2 pages.

Terence B. Hook, et al., "Independent Gate FinFET With Backside Gate Contact", U.S. Appl. No. 15/874,308, filed Jan. 18, 2018.

* cited by examiner

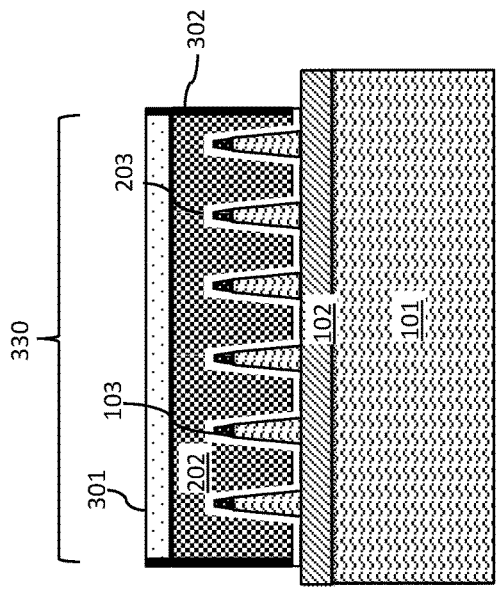
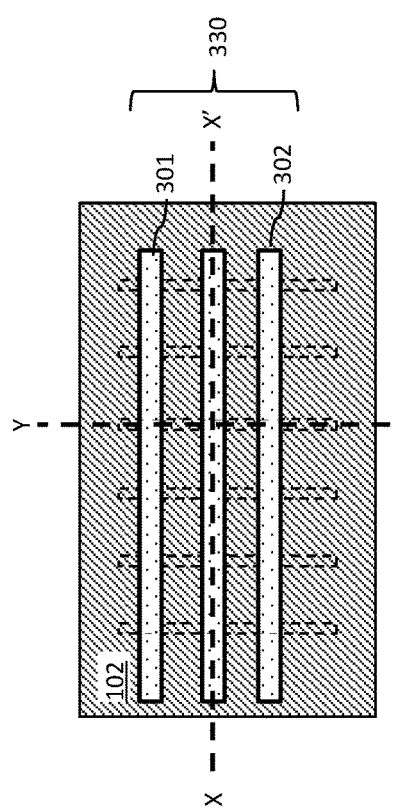
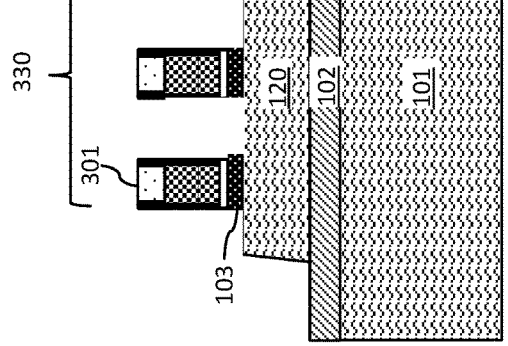
FIG. 3B
FIG. 3C
FIG. 3A

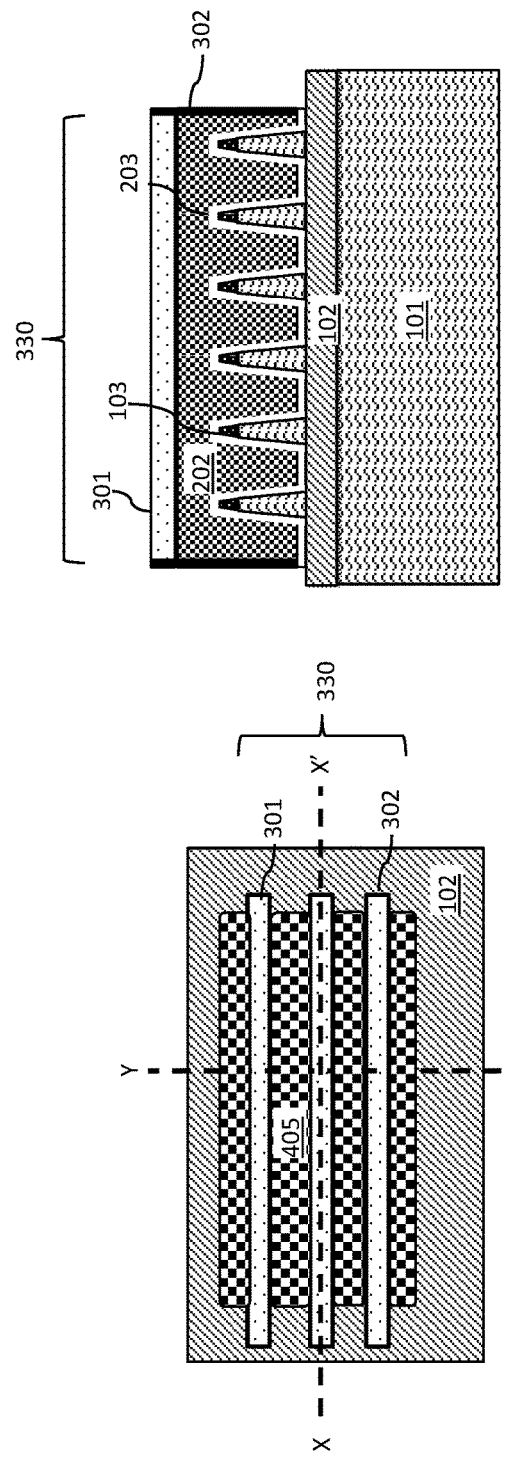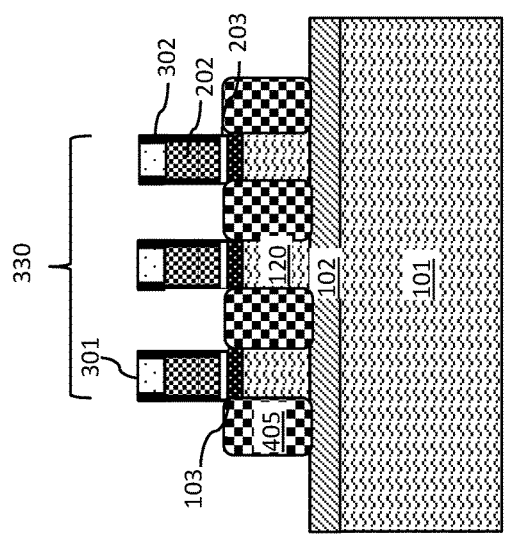
FIG. 4A
FIG. 4B
FIG. 4C

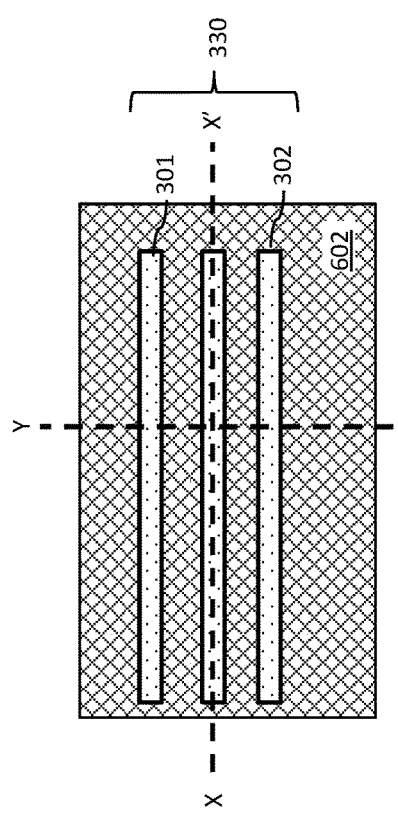
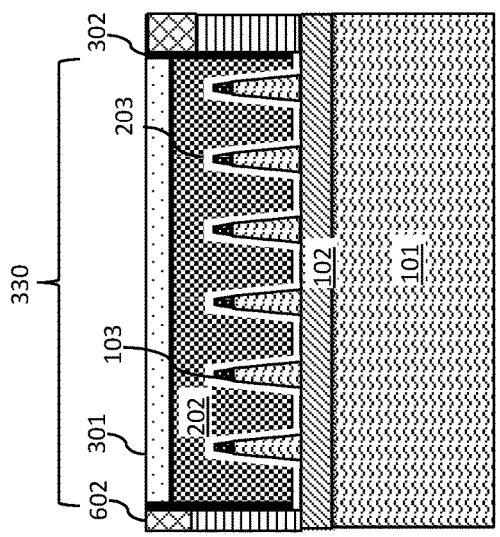
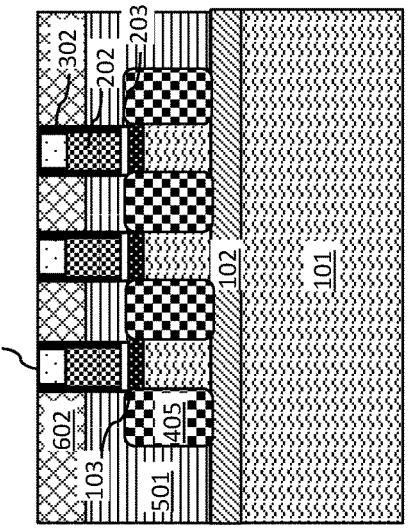
FIG. 6A
FIG. 6B
FIG. 6C

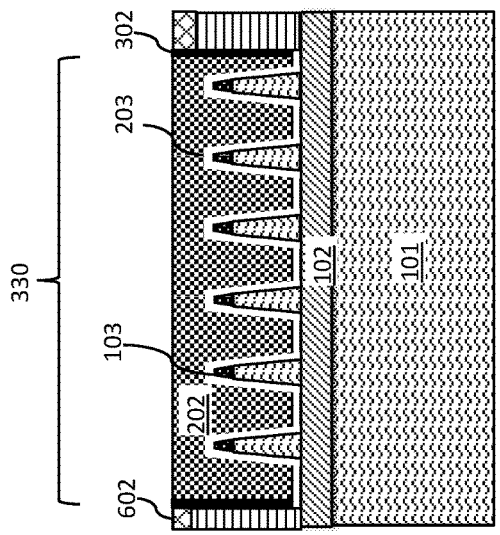
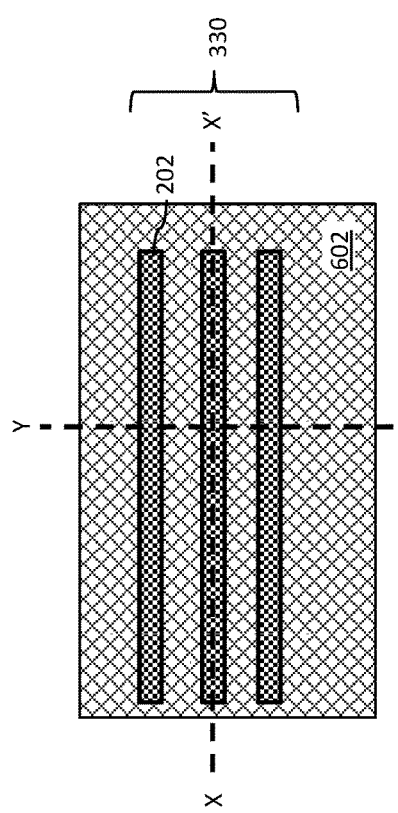
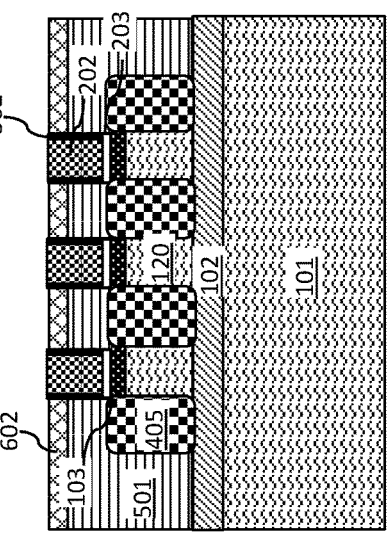
FIG. 7A
FIG. 7B
FIG. 7C

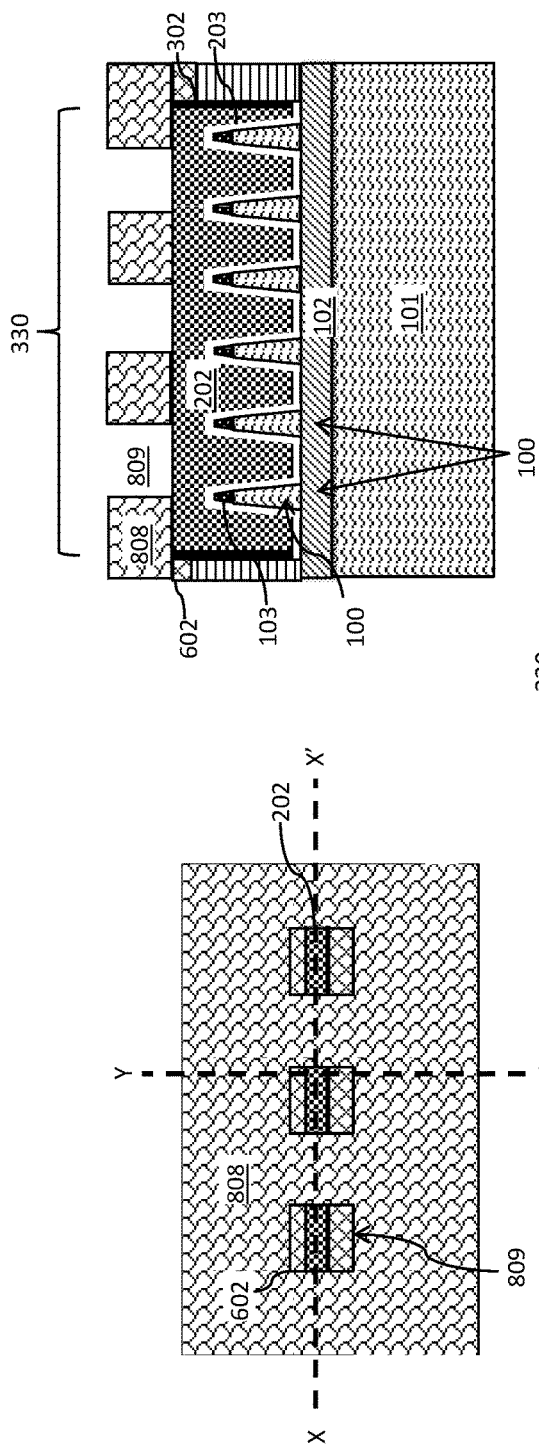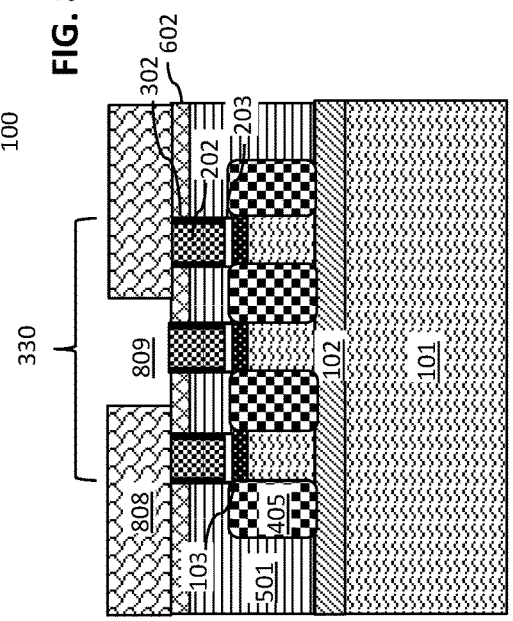
FIG. 8A
FIG. 8B
FIG. 8C

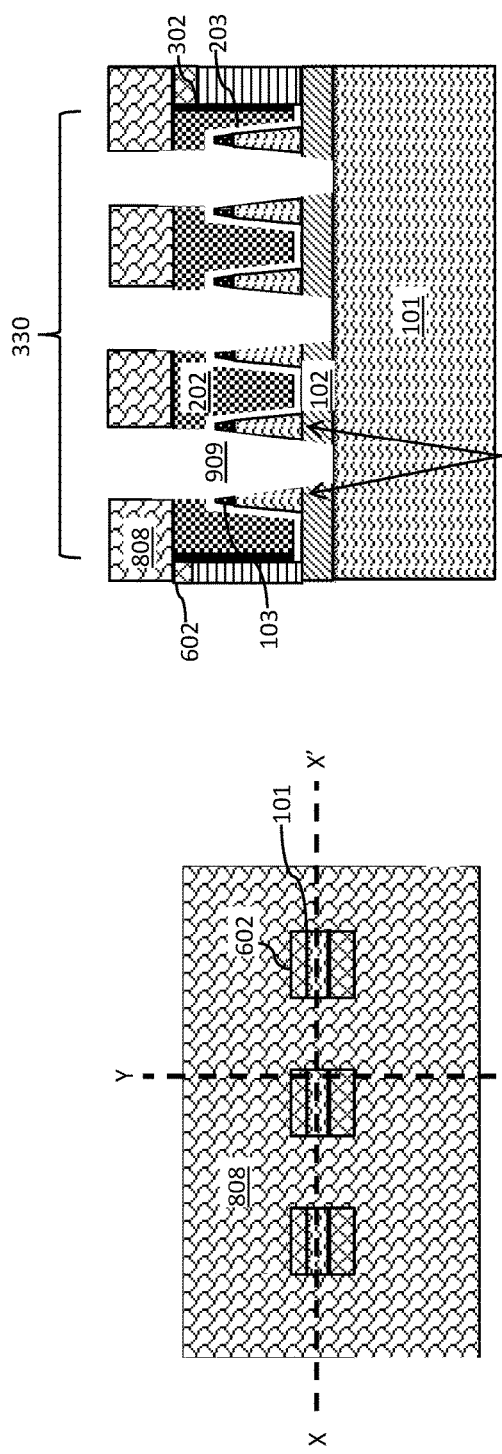
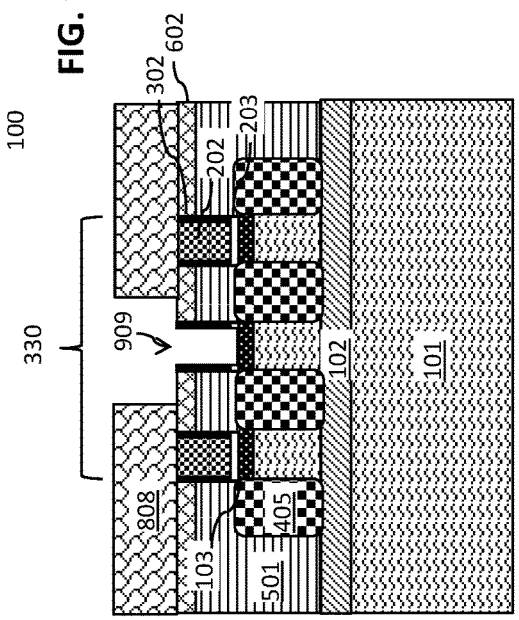
FIG. 9A
FIG. 9B
FIG. 9C

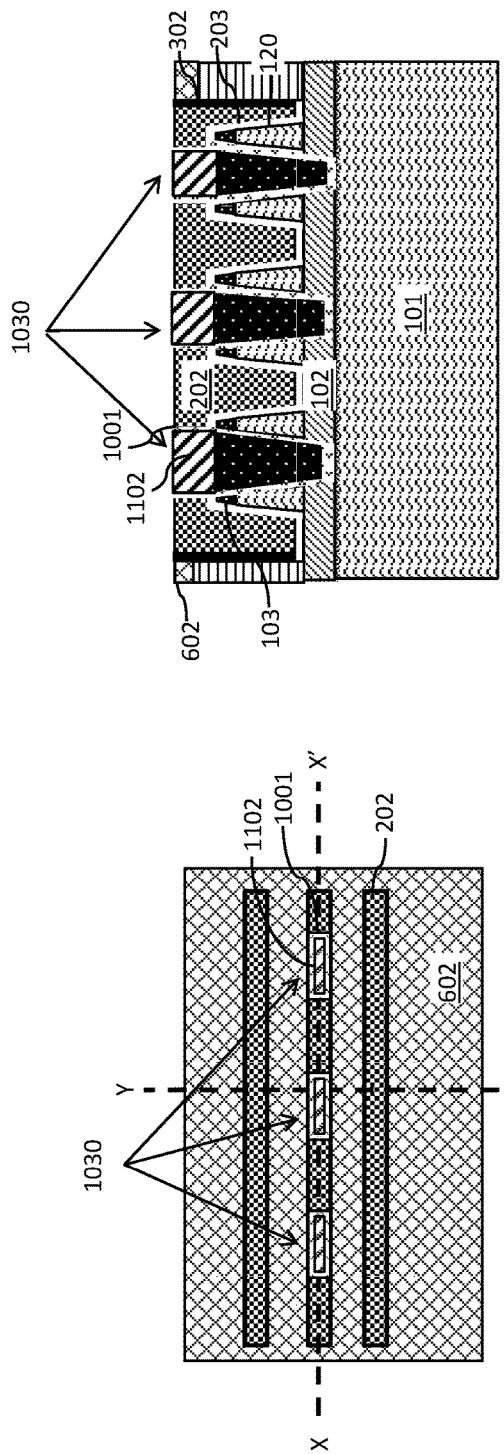
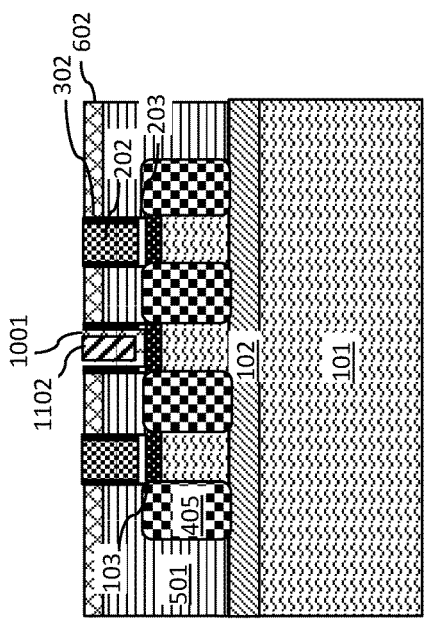
FIG. 11A
FIG. 11B
FIG. 11C

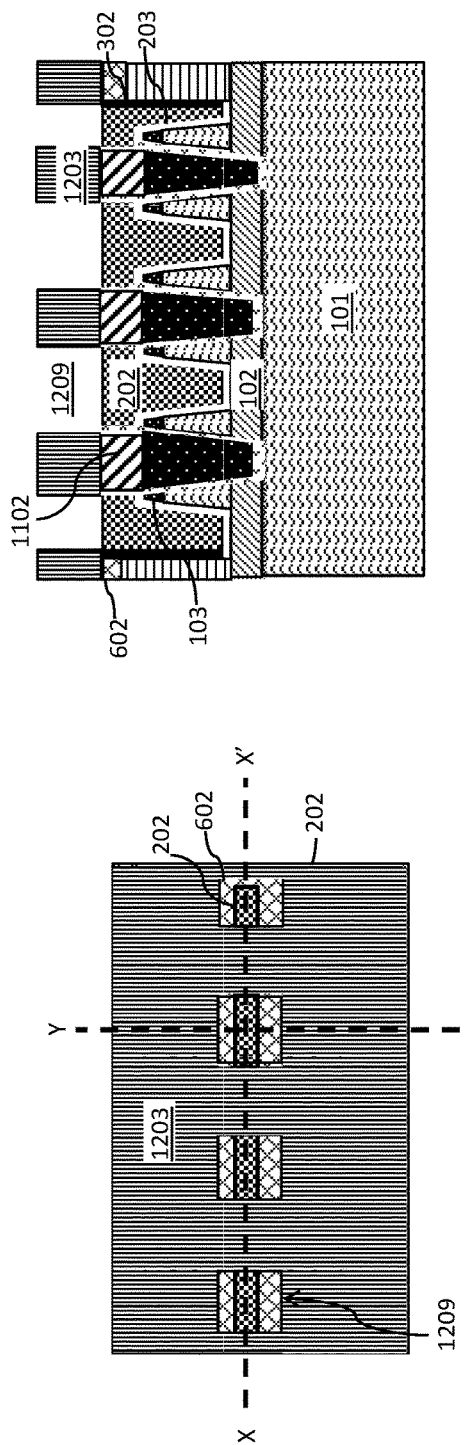
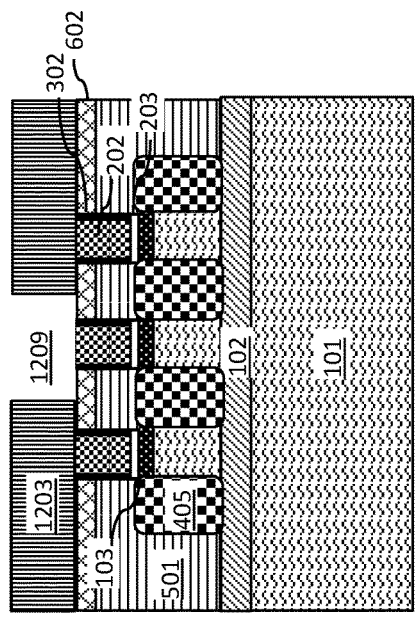
FIG. 12B
FIG. 12C
FIG. 12A

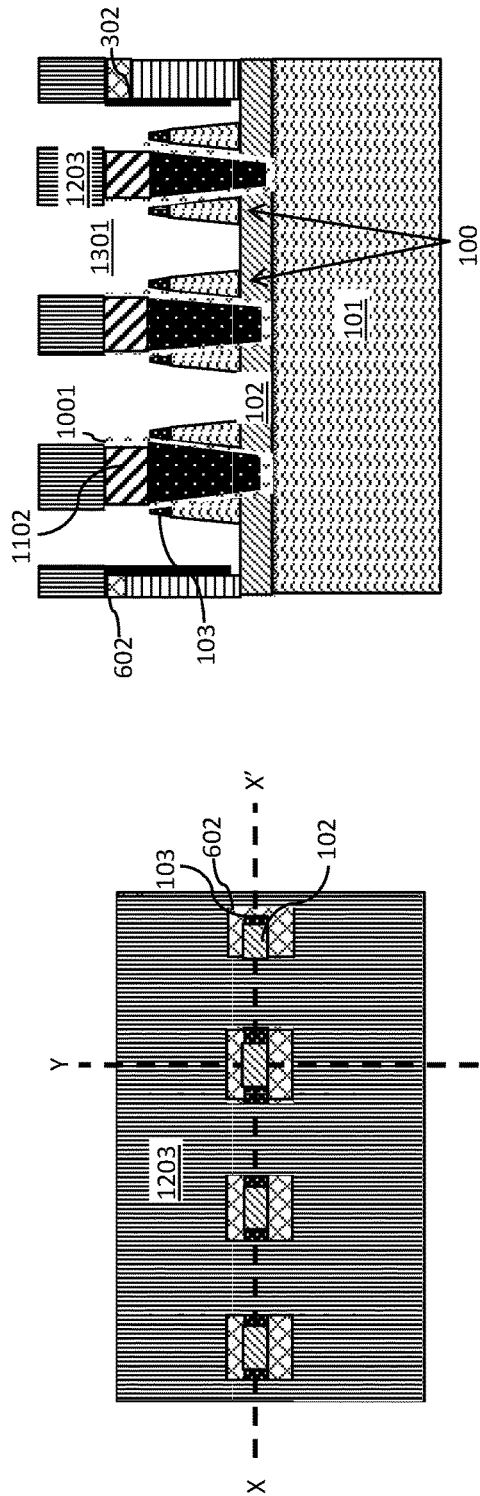
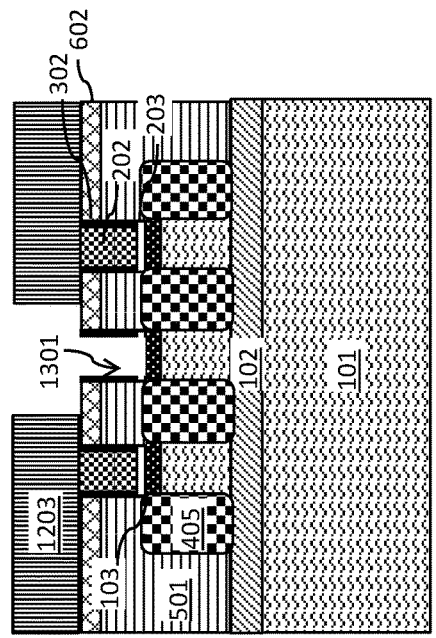
FIG. 13A
FIG. 13B
FIG. 13C

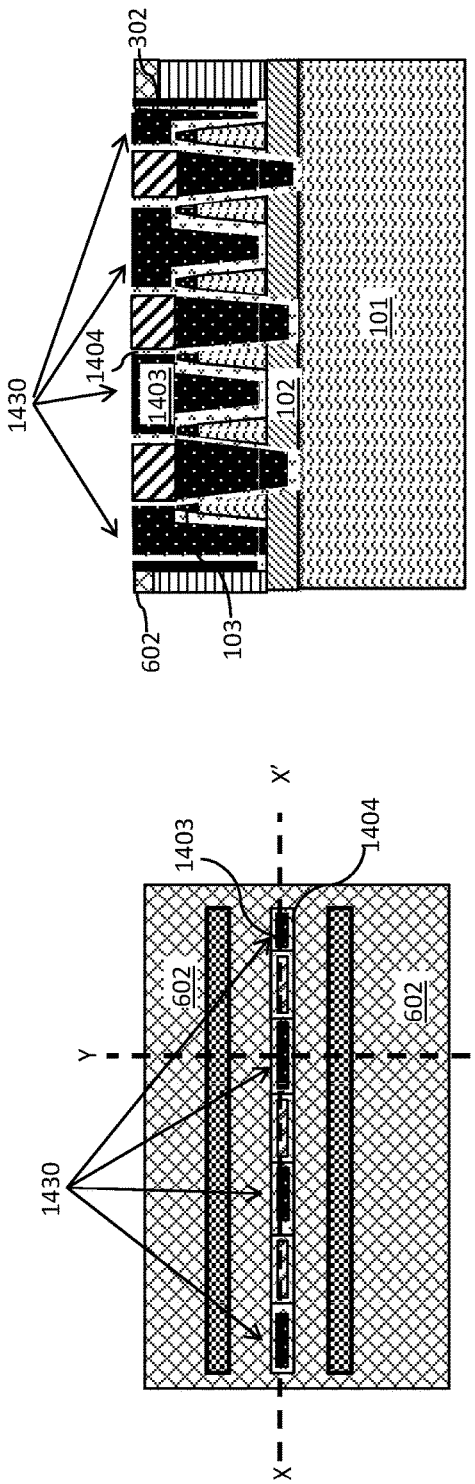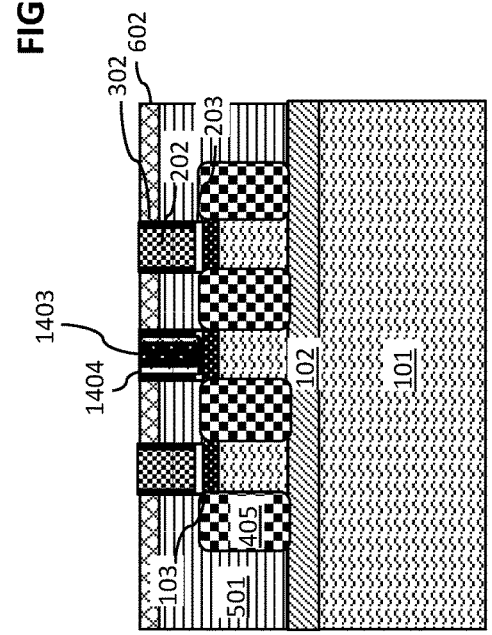
FIG. 14B
FIG. 14C
FIG. 14A

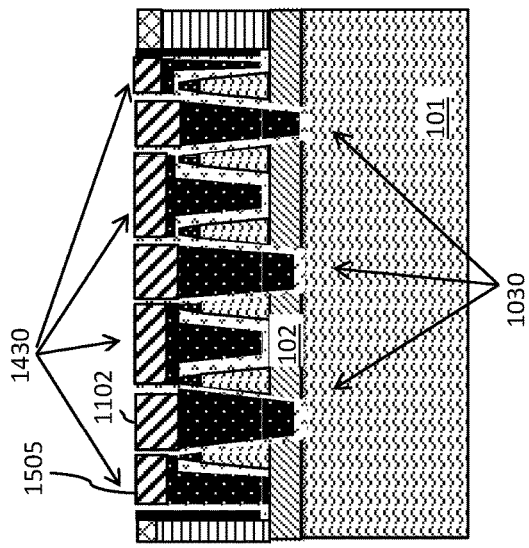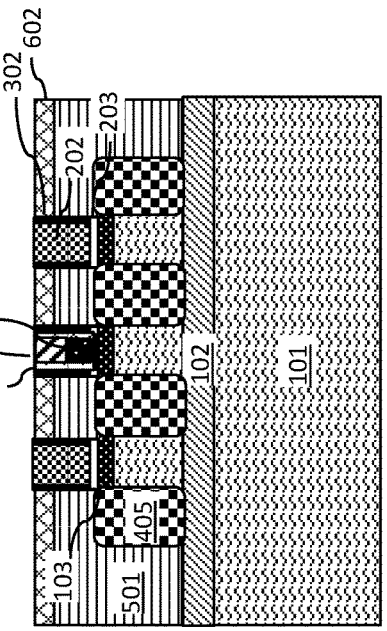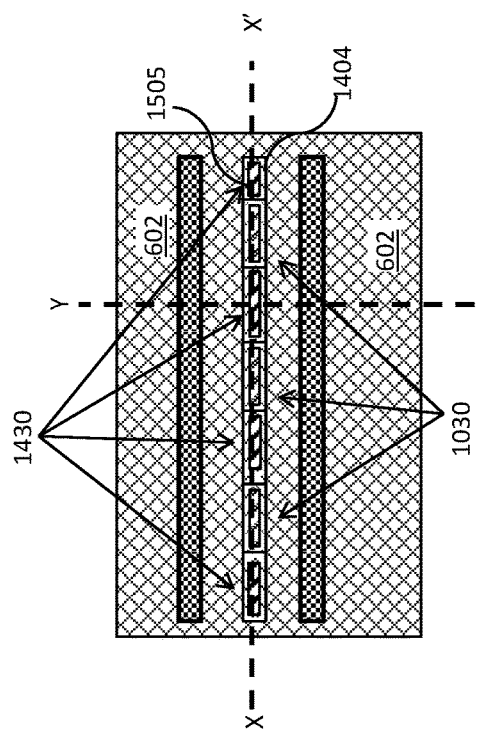
FIG. 15B
FIG. 15C
FIG. 15A

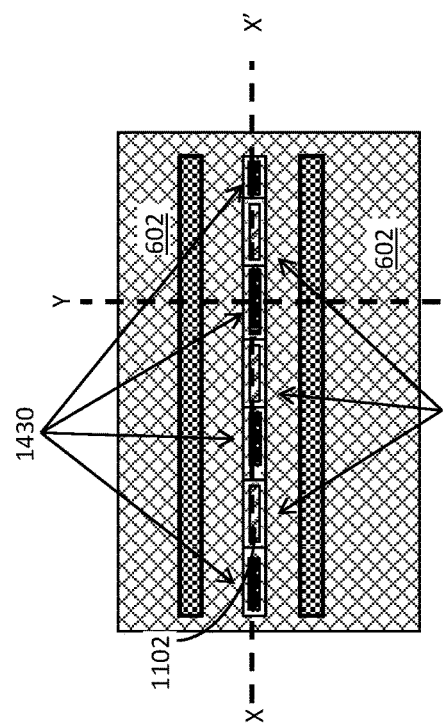
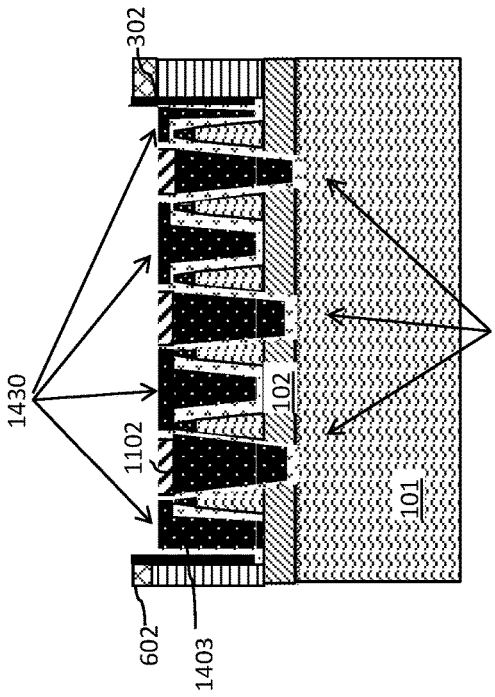
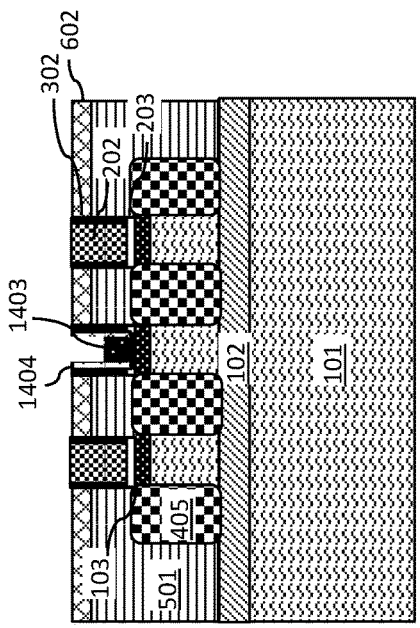
FIG. 16A
FIG. 16B
FIG. 16C

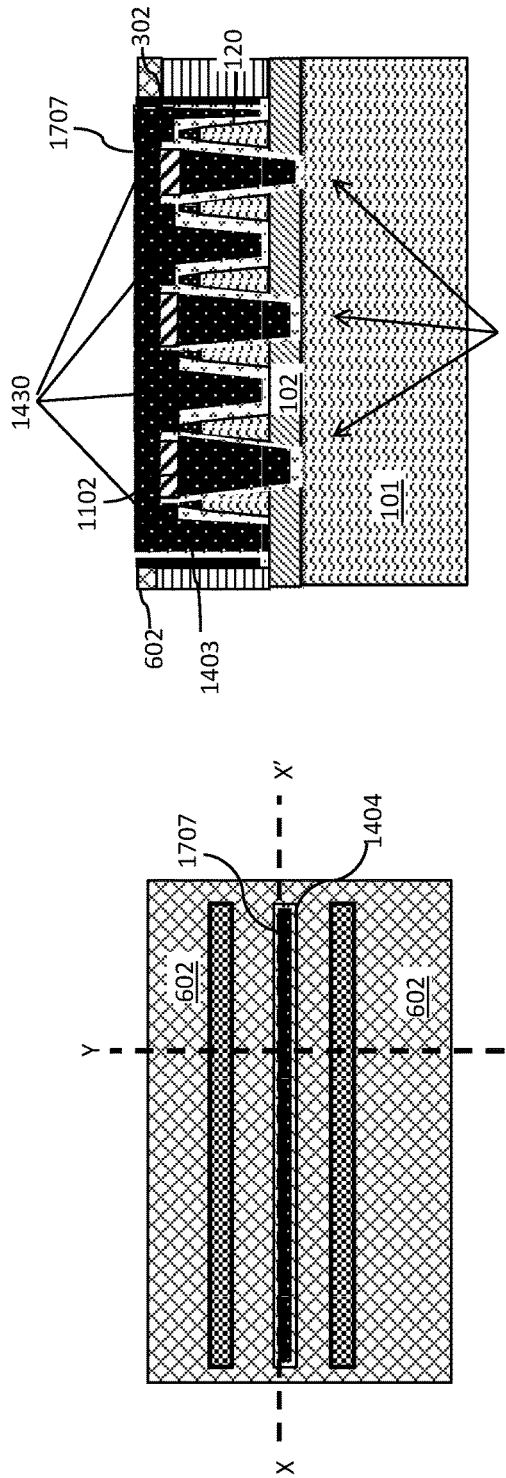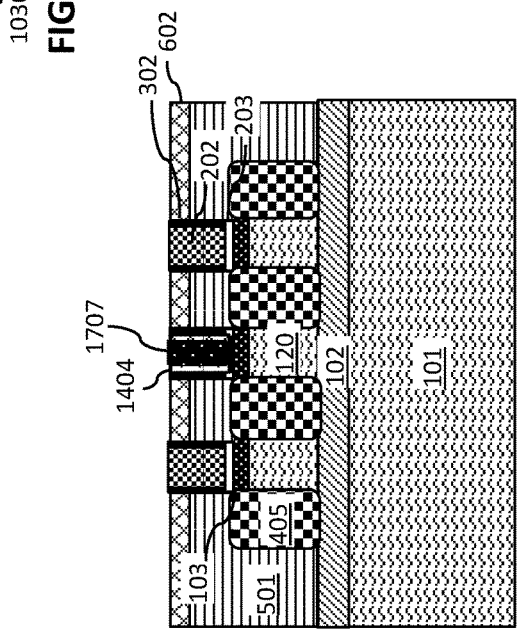
FIG. 17A
FIG. 17B
FIG. 17C

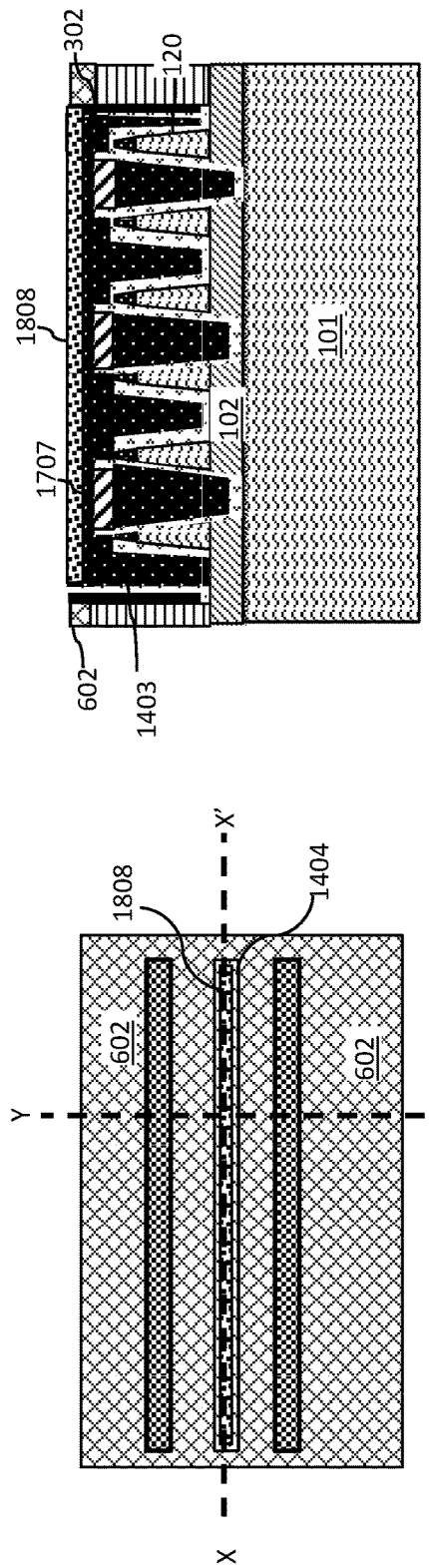
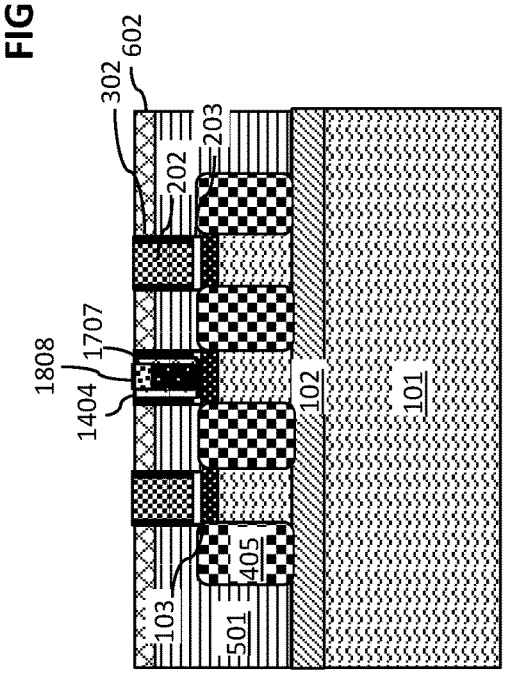
FIG. 18A
FIG. 18B
FIG. 18C

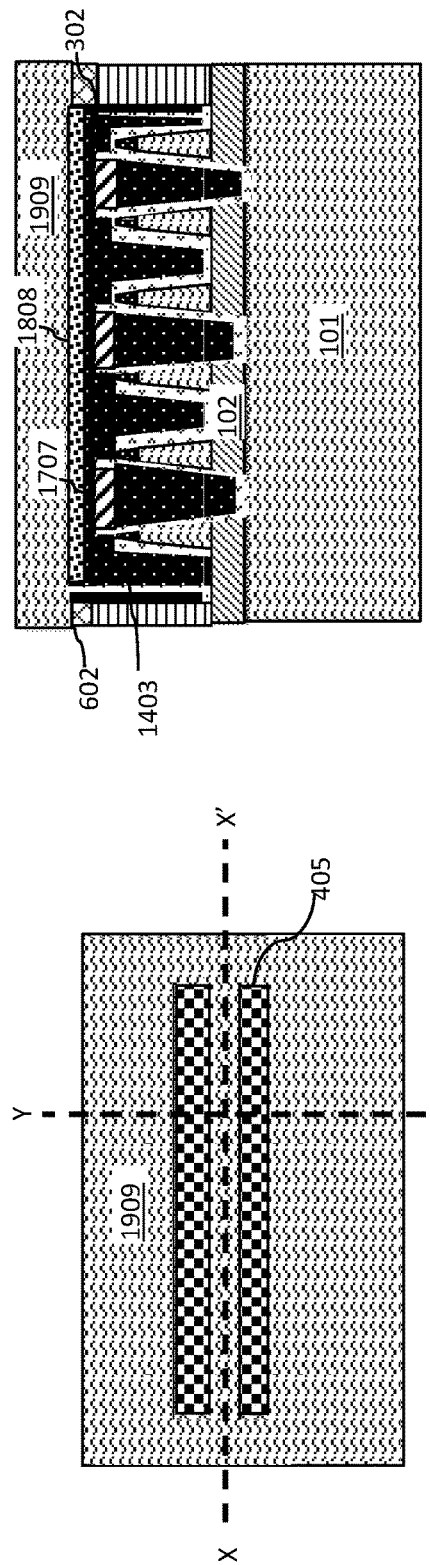
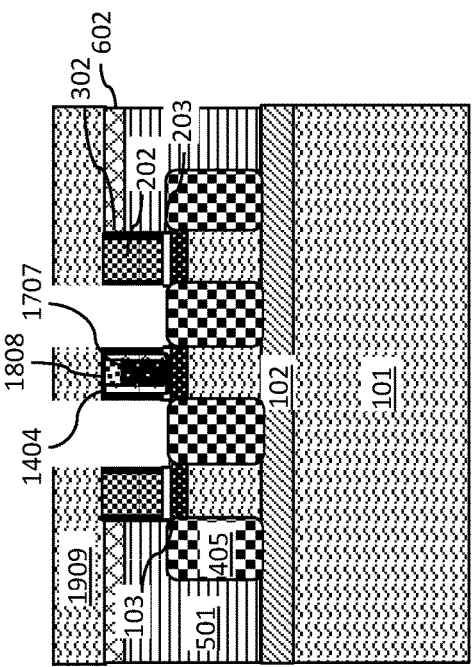
FIG. 19B
FIG. 19C
FIG. 19A

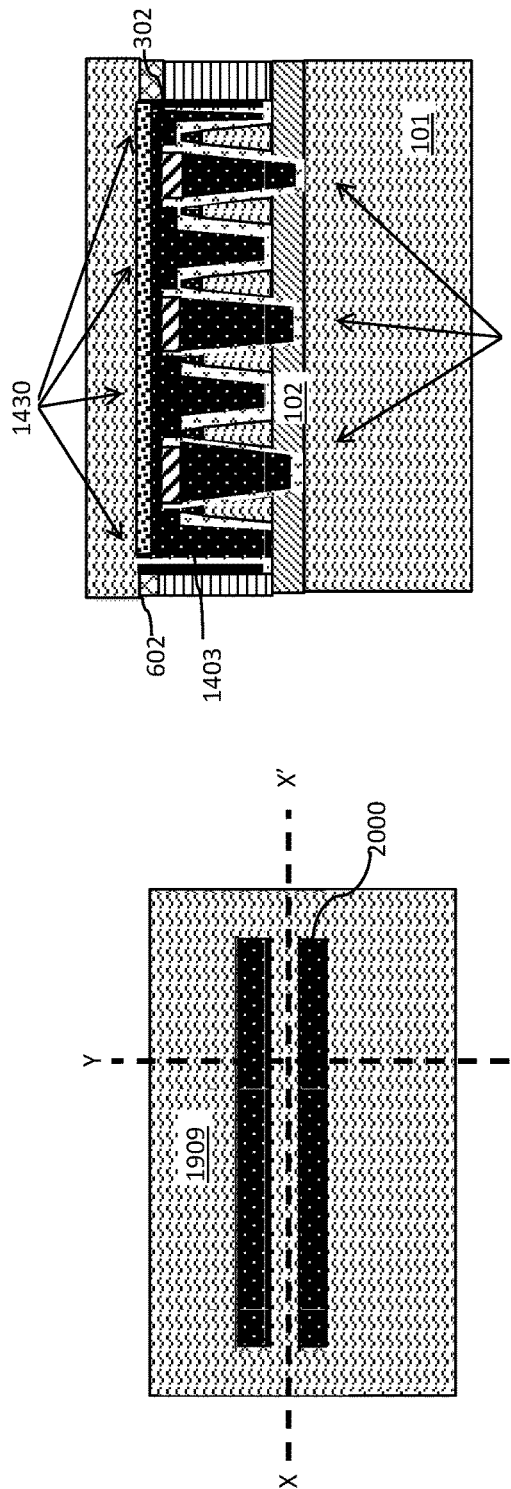
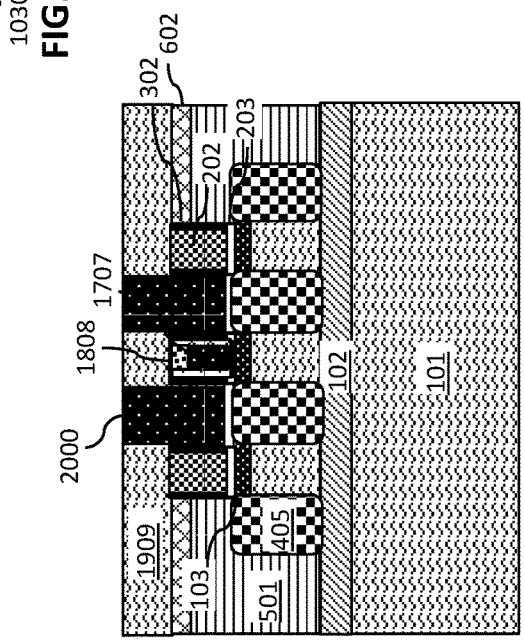
FIG. 20B
FIG. 20C
FIG. 20A

US 10,128,377 B2

INDEPENDENT GATE FINFET WITH BACKSIDE GATE CONTACT

BACKGROUND

Embodiments of the present invention relate to complementary metal oxide semiconductor (CMOS) technology, and more specifically, to independent gates in FinFET devices.

CMOS technology is used to construct integrated circuits such as microprocessors, microcontrollers, static random access memory (RAM) and other digital logic circuits. A basic component of CMOS designs is metal oxide semiconductor field effect transistors (MOSFETs).

The FinFET is a type of MOSFET. The FinFET is a double-gate or multiple-gate MOSFET device that mitigates the effects of short channels and reduces drain-induced barrier lowering. The "fin" refers to the narrow channel between source and drain regions. A thin dielectric layer on either side of the fin separates the fin channel from the gate.

SUMMARY

According to one or more embodiments, a method of making a semiconductor device includes forming a plurality of fins on a substrate, the substrate including an oxide layer beneath the plurality of fins. A sacrificial gate material is deposited on and around the plurality of fins. First trenches are formed in the sacrificial gate material. The first trenches extend through the oxide layer to a top surface of the substrate and are arranged between fins of the plurality of fin. First trenches are filled with a metal gate stack. Second trenches are formed in the sacrificial gate material, with a bottom surface of the second trenches being arranged over a bottom surface of the first trenches, and the second trenches being arranged between fins of the plurality of fins and alternating with the first trenches. The second trenches are filled with a metal gate stack.

According to other embodiments, a method of making a semiconductor device includes forming a plurality of fins on a substrate, the substrate including an oxide layer beneath the plurality of fins. A sacrificial gate material is deposited on and around the plurality of fins. First trenches are formed in the sacrificial gate material, with the first trenches extending through the oxide layer to a top surface of the substrate and being arranged between fins of the plurality of fins. First trenches are filled with a metal gate stack. Second trenches are formed in the sacrificial gate material, with a bottom surface of the second trenches being arranged over a bottom surface of the first trenches, and the second trenches being arranged between fins of the plurality of fins and alternating with the first trenches. Second trenches are filled with a metal gate stack. Metal gate stacks of the first trenches are recessed, and a dielectric material is deposited on a recessed region of the metal gate stack of the first trenches. A metal is deposited on the metal gate stacks of the second trenches and the dielectric material of the first trenches to connect the metal gate stacks of the second trenches, with the metal gate stacks of the first trenches being isolated from the metal gate stacks of the second trenches by the dielectric material.

Yet, according to other embodiments, a semiconductor device includes a substrate, with an oxide layer arranged on the substrate. The semiconductor device includes a fin extending from the substrate, and a gate formed on the fin that extends substantially perpendicular to the fin. The gate includes a dielectric cap on a top surface of the gate. The gate includes alternating first portions and second portions, with the first portions arranged below the second portions. The first portions contact the substrate and extend through the oxide layer to dielectric layers that are beneath the dielectric ca. The second portions extend from a top surface of the oxide layer to the dielectric cap.

BRIEF DESCRIPTION OF THE DRAWINGS

The subject matter which is regarded as embodiments of the invention is particularly pointed out and distinctly claimed in the claims at the conclusion of the specification. The foregoing and other advantages of the embodiments of the invention are apparent from the following detailed description taken in conjunction with the accompanying drawings in which:

FIGS. 1A-20C illustrate exemplary methods of making semiconductor devices according to embodiments, in which:

FIG. 1A is top view of fins patterned in a substrate;

FIG. 3A is a top view after forming dummy gates;

FIG. 3B is a cross-sectional side view through the X-X' axis of FIG. 3A;

FIG. 3C is a cross-sectional side view through the Y-Y' axis of FIG. 3A;

FIG. 4A is a top view after forming source/drains;

FIG. 4B is a cross-sectional side view through the X-X' axis of FIG. 4A;

FIG. 4C is a cross-sectional side view through the Y-Y' axis of FIG. 4A;

FIG. 6A is a top view after recessing the first oxide and depositing a second oxide;

FIG. 6B is a cross-sectional side view through the X-X' axis of FIG. 6A;

FIG. 6C is a cross-sectional side view through the Y-Y' axis of FIG. 6A;

FIG. 7A is a top view after removing the dummy gate hard mask;

FIG. 7B is a cross-sectional side view through the X-X' axis of FIG. 7A;

FIG. 7C is a cross-sectional side view through the Y-Y' axis of FIG. 7A;

FIG. 8A is a top view after patterning a first stage of dummy gate material removal;

FIG. 8B is a cross-sectional side view through the X-X' axis of FIG. 8A;

FIG. 8C is a cross-sectional side view through the Y-Y' axis of FIG. 8A;

FIG. 9A is a top view after removing a first stage of dummy gate material and over etching through the oxide layer to form first trenches;

FIG. 9B is a cross-sectional side view through the X-X' axis of FIG. 9A;

FIG. 9C is a cross-sectional side view through the Y-Y' axis of FIG. 9A;

FIG. 11A is a top view after recessing the metal fill in the first trenches and depositing a dielectric material;

FIG. 11B is a cross-sectional side view through the X-X' axis of FIG. 11A;

FIG. 11C is a cross-sectional side view through the Y-Y' axis of FIG. 11A;

FIG. 12A is a top view after patterning a second stage of dummy gate material removal;

FIG. 12B is a cross-sectional side view through the X-X' axis of FIG. 12A;

FIG. 12C is a cross-sectional side view through the Y-Y' axis of FIG. 12A;

FIG. 13A is a top view after removing the second stage of dummy gate material to form second trenches;

FIG. 13B is a cross-sectional side view through the X-X' axis of FIG. 13A;

FIG. 13C is a cross-sectional side view through the Y-Y' axis of FIG. 13A;

FIG. 14A is a top view after filling the first trenches with metals and removing the mask;

FIG. 14B is a cross-sectional side view through the X-X' axis of FIG. 14A;

FIG. 14C is a cross-sectional side view through the Y-Y' axis of FIG. 14A;

FIG. 15A is a top view after recessing the metal fill in the second trenches and depositing a dielectric material;

FIG. 15B is a cross-sectional side view through the X-X' axis of FIG. 15A;

FIG. 15C is a cross-sectional side view through the Y-Y' axis of FIG. 15A;

FIG. 16A is a top view after patterning a gate contact;

FIG. 16B is a cross-sectional side view through the X-X' axis of FIG. 16A;

FIG. 16C is a cross-sectional side view through the Y-Y' axis of FIG. 16A;

FIG. 17A is a top view after filling the gate contact;

FIG. 17B is a cross-sectional side view through the X-X' axis of FIG. 17A;

FIG. 17C is a cross-sectional side view through the Y-Y' axis of FIG. 17A;

FIG. 18A is a top view after recessing the gate contact filling and forming a dielectric gate cap;

FIG. 18B is a cross-sectional side view through the X-X' axis of FIG. 18A;

FIG. 18C is a cross-sectional side view through the Y-Y' axis of FIG. 18A;

FIG. 19A is a top view after patterning the source/drain contacts

FIG. 19B is a cross-sectional side view through the X-X' axis of FIG. 19A;

FIG. 19C is a cross-sectional side view through the Y-Y' axis of FIG. 19A;

FIG. 20A is a top view after filling the source/drain contact trenches;

FIG. 20B is a cross-sectional side view through the X-X' axis of FIG. 20A;

FIG. 20C is a cross-sectional side view through the Y-Y' axis of FIG. 20A;

FIG. 21A-21D illustrate methods for forming contacts to the independent gates of the device in FIG. 20B according to embodiments, in which:

FIG. 21A is a cross-sectional side view after flipping the structure shown in FIG. 20B and bonding to a substrate;

FIG. 21B is a cross-sectional side view after forming metal contact layer on the back side of the device;

FIG. 21C is a cross-sectional side view after flipping the device again and bonding to another substrate; and FIG. 21D is a cross-sectional side view after forming contacts to both gate portions;

FIGS. 22A and 22B illustrate methods for forming contacts to the independent gates of the device of FIG. 20B according to embodiments, in which:

FIG. 22A is a cross-sectional side view after forming a first contact through the oxide layer; and FIG. 22B is a cross-sectional side view after flipping the device and forming a second backside contact;

FIGS. 23A-23C illustrate methods for forming a device according to embodiments, in which:

FIG. 23A is a cross-sectional side view of an initial structure in which a metal layer is bonded to patterned fins (combining a metal layer with FIG. 1B);

FIG. 23B is a cross-sectional side view after following the process flow shown in FIGS. 2A-20C; and FIG. 23C is a cross-sectional side view after forming contacts to the independent gates.

DETAILED DESCRIPTION

Figure 1B:
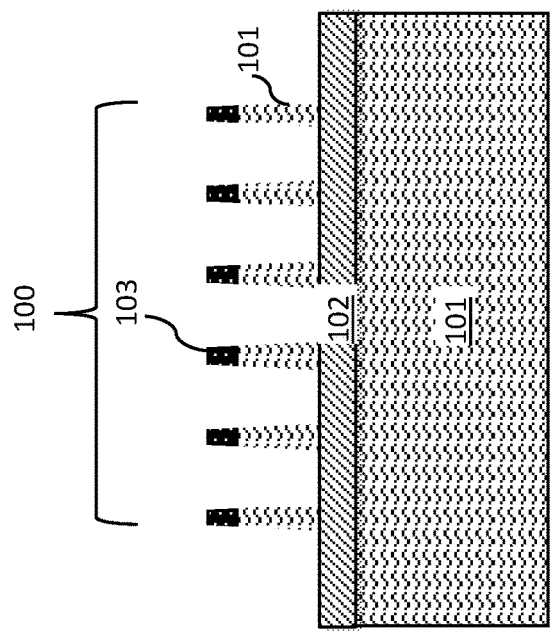
FIG. 1B is a cross-sectional side view through the X-X' axis of FIG. 1A.

Embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature or characteristic, but every embodiment may or may not include the particular structure or characteristic. Moreover, such phrases are not necessarily referring to the same embodiment. Further, when a particular structure or characteristic is described in connection with an embodiment, it is submitted that it is within the knowledge of one skilled in the art to affect such structure or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to aspects of the present invention, independent gate FETs are useful for voltage tuning in analog applications. Independent gates allow for independent gate control on either side of the channel. Mixers and current amplifiers can benefit from independent gate implementation. Independent functionality of device gates also can enable exploration of novel digital logic.

However, forming independent gates has been limited to FinFET devices with single individual fins. For devices with multiple fins, it is challenging to wire the corresponding gates together, while maintaining the wiring for the source and drains in scaled technologies.

Accordingly, described herein are process flows and devices that utilize the backside of the device to provide a wiring path for the additional gate. Replacement gate processing is performed in two stages to form independent gate electrodes. A first gate process uses over etching to making an opening through the oxide layer to an underlying gate wire. The methods spatially separate the contact layer for the independent gates, forming one gate above the device and one gate below the device. In embodiments, by forming a gate resembling an interdigitated comb, every other gate can be routed in the traditional form above the device, or through the oxide layer below the device. In embodiments, a pre-existing underlying gate wire can eliminate post device wafer bonding and thinning.

Figure 1A:
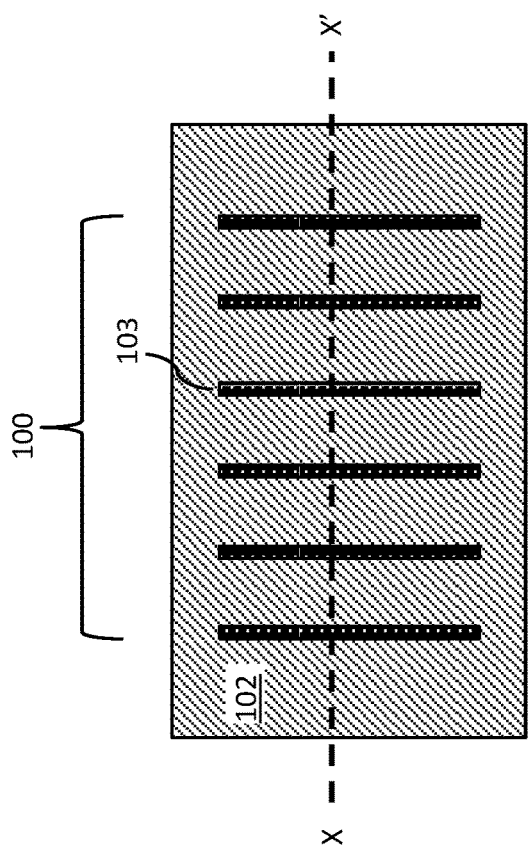

Turning now to a detailed description of aspects of the present invention, FIGS. 1A-20C illustrate exemplary methods of making semiconductor devices according to embodiments. FIG. 1A is top view of fins 100 patterned in a substrate 101. FIG. 1B is a cross-sectional side view through the X-X' axis of FIG. 1A. Non-limiting examples of substrate 101 materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof.

The substrate 101 includes an oxide layer 102. The composition of the oxide layer 102 depends on the composition of the substrate 101, as well as prior treatments performed on the substrate 101. The oxide layer 102 can be, for example, silicon dioxide ($SiO_2$). In another example, the substrate 101 includes germanium, and the oxide layer 102 includes germanium dioxide ($GeO_2$). In a further example, the substrate 101 includes GaAs, and the oxide layer 102 includes $Ga_2O_3$, $As_2O_3$, $As_2O_5$, or any combination thereof.

The fins 100 include hard mask caps 103 that protect the fins 100 during subsequent processing. The hard mask caps 103 include, for example, silicon nitride, in one or more embodiments. In other embodiments, the hard mask caps 103 include another hard mask material.

The fins 100 can be formed in the substrate 101 after initially depositing the hard mask material forming the hard mask caps 103 on the substrate 101. The fins 100 can be patterned in the substrate 101 by, for example, sidewall imaging transfer. Any number of fins 100 can be formed in the substrate 101, including more than one fin to form a plurality of fins. Six fins are only shown for illustrative purposes. A plurality of fins 100 arranged on the substrate 101 includes more than one fin 100. The fins of the plurality of fins are arranged on the oxide layer 102.

Figure 2B:
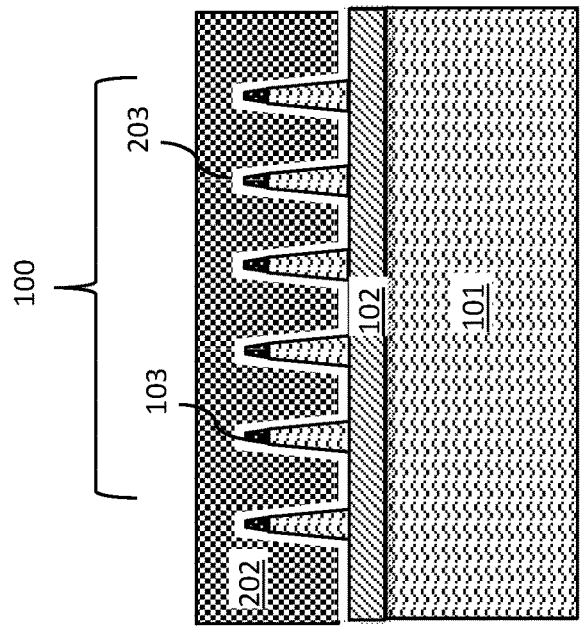
FIG. 2B is a cross-sectional side view through the X-X' axis of FIG. 2A.
Figure 2A:
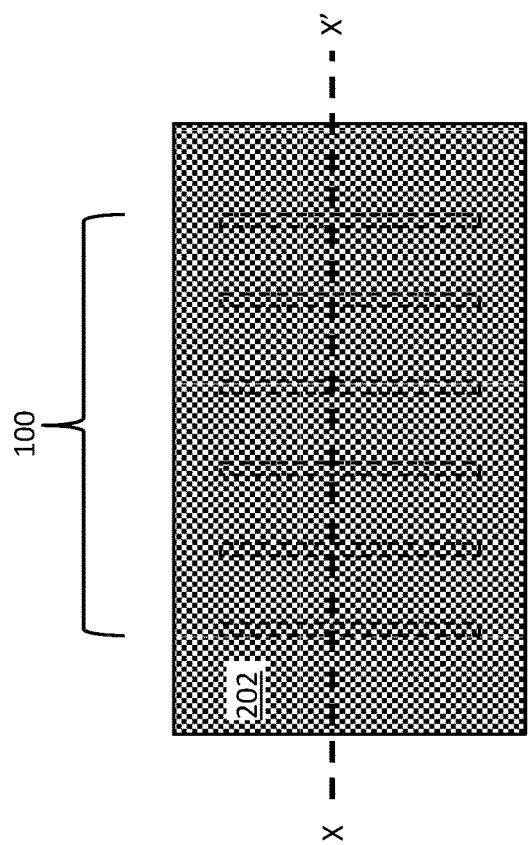
FIG. 2A is a top view after depositing a dummy gate material on the fins.

FIG. 2A is a top view after depositing a dummy gate material 202 on and around the fins 100. FIG. 2B is a cross-sectional side view through the X-X' axis of FIG. 2A. The dummy gate material 202 (or sacrificial gate material) will be subsequently replaced with a metal gate stack to form the final metal gates. The dummy gate material 202 is a sacrificial material, for example, amorphous silicon (aSi) or polycrystalline silicon (polysilicon). The dummy gate material 202 can be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof.

Dummy oxides 203 are formed around the fins 100. A dummy material is deposited on the fins 100. The dummy oxide 203 protects the fins 100 during etching (see, for example, FIGS. 9A-9C). Non-limiting examples of suitable materials for the dummy oxide 203 include dielectric oxides (e.g., silicon oxide), dielectric nitrides (e.g., silicon nitride), dielectric oxynitrides, or any combination thereof.

FIG. 3A is a top view after patterning dummy gates 330. FIG. 3B is a cross-sectional side view through the X-X' axis of FIG. 3A. FIG. 3C is a cross-sectional side view through the Y-Y' axis of FIG. 3A. The dummy gates 330 include a hard mask layer 301 for example, silicon nitride (SiN), SiOCN, or SiBCN. The hard mask layer 301 is deposited on the dummy gate material 202 to form gate caps. The hard mask layer 301 can be deposited using a deposition process, including, but not limited to, PVD, CVD, PECVD, or any combination thereof. The dummy gate material 202 and hard mask material 301 is then patterned and etched to form the dummy gates 330.

Gate spacers 302 are formed along sidewalls of the dummy gates 330. A dielectric material, for example, silicon dioxide, silicon nitride, SiOCN, or SiBCN, is deposited on the dummy gate material 202 and then etched to form gate spacers 302. Other non-limiting examples of materials for the gate spacers 302 include dielectric oxides (e.g., silicon oxide), dielectric nitrides (e.g., silicon nitride), dielectric oxynitrides, or any combination thereof. The gate spacer 302 material is deposited by a deposition process, for example, chemical vapor deposition (CVD) or physical vapor deposition (PVD). An anisotropic dry etch process, for example, reactive ion etch (RIE), is performed to etch the spacer material and form gate spacers 302 around the dummy gates 330.

FIG. 4A is a top view after forming source/drains on opposing sides of the dummy gates 330. FIG. 4B is a cross-sectional side view through the X-X' axis of FIG. 4A. FIG. 4C is a cross-sectional side view through the Y-Y' axis of FIG. 4A. Before forming the source/drains 405, the substrate 101 material and the spacer 302 material is etched (as shown in FIG. 4C) around the dummy gates 330. The source/drains 405 can be formed by epitaxially growing a semiconductor material layer on the substrate 101 around the dummy gates 330. Epitaxial layers forming the source/drains 405 can be grown using a suitable growth process, for example, chemical vapor deposition (CVD) (liquid phase (LP) or reduced pressure chemical vapor deposition (RP-CVD), vapor-phase epitaxy (VPE), molecular-beam epitaxy (MBE), liquid-phase epitaxy (LPE), metal organic chemical vapor deposition (MOCVD), or other suitable processes. Alternatively, the source/drains 405 can be formed by incorporating dopants into the substrate 101.

Figure 5B:
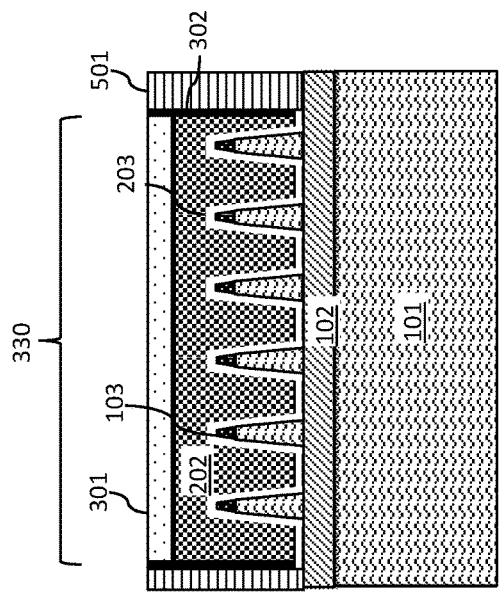
FIG. 5B is a cross-sectional side view through the X-X' axis of FIG. 5A.
Figure 5A:
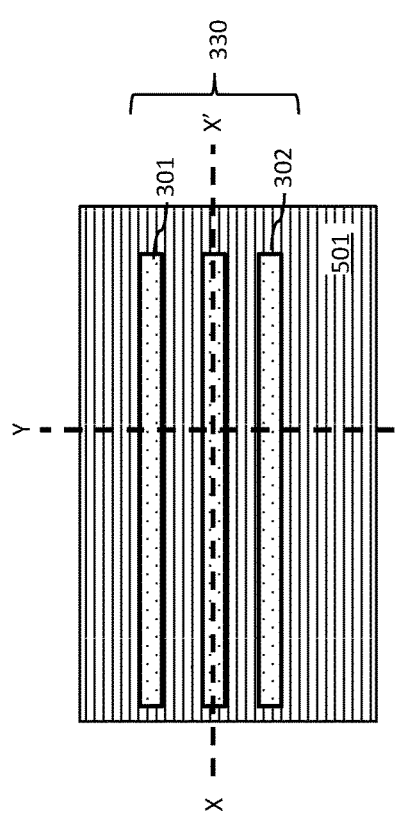
FIG. 5A is a top view after depositing a first oxide around the dummy gates.
Figure 5C:
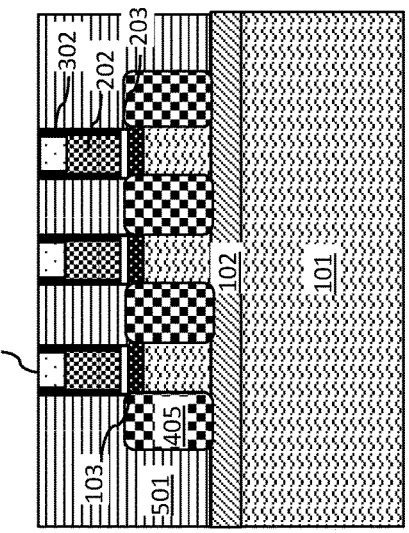
FIG. 5C is a cross-sectional side view through the Y-Y' axis of FIG. 5A.

FIG. 5A is a top view after depositing a first oxide 501 around the dummy gates 330. FIG. 5B is a cross-sectional side view through the X-X' axis of FIG. 5A. FIG. 5C is a cross-sectional side view through the Y-Y' axis of FIG. 5A. The first oxide 501 covers the source/drains 405 and fills the spaces between the dummy gates 330. The first oxide 501 is deposited on the dummy gates 330. Then a planarization process is performed, for example, chemical mechanical planarization (CMP) down to the level of the hard mask layer 301 such that the hard mask layer 301 is exposed. The first oxide 501 can be, but not limited to, silicon oxide, spin-on-glass, a flowable oxide (FOX), a high density plasma oxide, borophosphosilicate glass (BPSG), or any combination thereof.

FIG. 6A is a top view after recessing the first oxide 501 and depositing a second oxide 602 on the recessed first oxide 501. FIG. 6B is a cross-sectional side view through the X-X' axis of FIG. 6A. FIG. 6C is a cross-sectional side view through the Y-Y' axis of FIG. 6A. The second oxide 602 can be, but not limited to, silicon oxide, spin-on-glass, a flowable oxide (FOX), a high density plasma oxide, borophosphosilicate glass (BPSG), or any combination thereof. After depositing the second oxide 602 on the first oxide 501 and the dummy gates 330, a planarization process is performed, for example, CMP, stopping on the hard mask layer 301.

FIG. 7A is a top view after removing the dummy gate hard mask layer 301. FIG. 7B is a cross-sectional side view through the X-X' axis of FIG. 7A. FIG. 7C is a cross-sectional side view through the Y-Y' axis of FIG. 7A. The hard mask layer 301 and a portion of the second oxide 602 are removed by etching, for example, by reactive ion etching (RIE). Another etch process, or a planarization process, such as CMP, can be performed to remove the remainder of the hard mask layer 301, stopping on the dummy gate material 202.

FIG. 8A is a top view after patterning a first stage of dummy gate material removal. FIG. 8B is a cross-sectional side view through the X-X' axis of FIG. 8A. FIG. 8C is a cross-sectional side view through the Y-Y' axis of FIG. 8A. As will be subsequently described, removing the dummy gate material and replacing with a metal gate is performed in two stages. The first stage is described in FIGS. 8A-11C. The second stage is described in FIGS. 12A-15C. Two stages are performed to form independent gate electrodes.

A patterning mask 808 is deposited on the substrate 101. The mask 808 can include an organic material, for example, a polymeric material. The mask 808 is patterned over at least one dummy gate 330, such that at least one opening 809 is formed over the dummy gate 330. Alignment of the opening 809 is critical at this stage because the opening, for example as shown in FIG. 8B must be arranged between fins 100. In other words, the opening 809 in the mask 808 should be properly aligned to protect the fins 100 so that when the dummy gate material 202 is removed through the openings 809, the fins 100 are not damaged. Although the spacer 203 material around each fins protect the fins 100, alignment of the mask 808 is important. The thickness of the spacer 203 material can also be tailored or increased to provide additional protection.

FIG. 9A is a top view after removing a first stage of dummy gate material 202 removal and over etching through the oxide layer 102 to form first trenches 909. FIG. 9B is a cross-sectional side view through the X-X' axis of FIG. 9A. FIG. 9C is a cross-sectional side view through the Y-Y' axis of FIG. 9A. The first trenches 909 are over etched to extend through the oxide layer 102 to a top surface of the substrate 101 (see FIG. 9B). Each first trench 909 is arranged between fins 100 of the plurality of fins 100. One or more etch processes can be performed to remove portions of both the dummy gate material 202 and the oxide layer 102. The first trenches extend from the substrate 101 to the top of the dummy gate material 202.

Figures 10A, 10B, 10C:
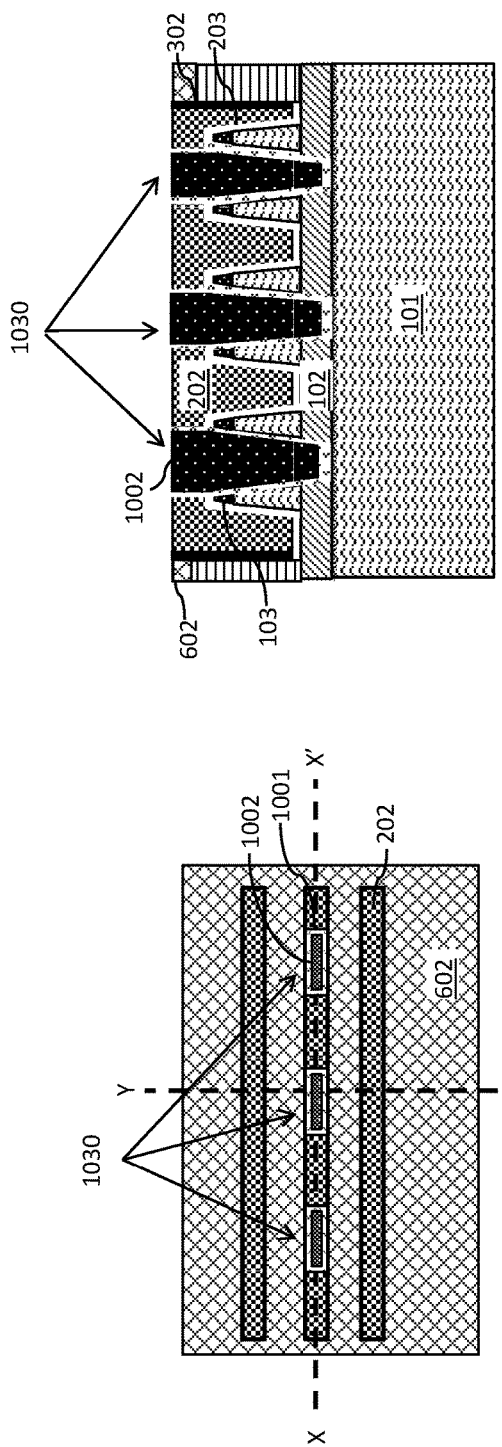
FIG. 10A is a top view after filling the first trenches with metals and removing the mask.
FIG. 10B is a cross-sectional side view through the X-X' axis of FIG. 10A.
FIG. 10C is a cross-sectional side view through the Y-Y' axis of FIG. 10A.

FIG. 10A is a top view after filling the first trenches 909 with metals to form a first portion 1030 of the final independent metal gates and removing the mask 808. FIG. 10B is a cross-sectional side view through the X-X' axis of FIG. 10A. FIG. 10C is a cross-sectional side view through the Y-Y' axis of FIG. 10A. The first portion 1030 of the final independent metal gates include one or more dielectric layers 1001 and a gate stack 1002 that includes one or more work function metals and gate metals. The gate dielectric layer(s) 1001 can be a dielectric material having a dielectric constant greater than about 3.9, about 7.0, or about 10.0. Non-limiting examples of suitable materials for the dielectric layers 1001 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The work function metal of the gate stack 1002 is disposed over the dielectric layers 1001. The type of work function metal(s) depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

The conductive gate metal of the gate stack 1002 is deposited over the work function layer(s) to form the gate stacks. Non-limiting examples of suitable conductive metals include aluminum (Al), platinum (Pt), gold (Au), tungsten (W), titanium (Ti), or any combination thereof. A planarization process, such as CMP, is performed to polish the surface of the metal gates.

FIG. 11A is a top view after recessing the metal fill of the gate stack 1002 and depositing a dielectric material 1102. FIG. 11B is a cross-sectional side view through the X-X' axis of FIG. 11A. FIG. 11C is a cross-sectional side view through the Y-Y' axis of FIG. 11A. The gate stack 1002 can be recessed by etching. The dielectric material 1102 can be, for example, silicon nitride (SiN), SiOCN, or SiBCN. After depositing the dielectric material 1102, a planarization process, such as CMP, is performed.

FIG. 12A is a top view after patterning a second stage of dummy gate material 202 removal. FIG. 12B is a cross-sectional side view through the X-X' axis of FIG. 12A. FIG. 12C is a cross-sectional side view through the Y-Y' axis of FIG. 12A. The second stage of dummy gate material removal 202 provides an alternate gate pattern that is different (and independent from) the first stage shown above to form the first portion 1030 of the final metal gates (see FIGS. 11A-11C). The first stage and the second stages form gates that function independently of one another.

Another patterning mask 1203 is deposited on the substrate 101. The mask 1203 can include an organic material, for example, a polymeric material. The mask 1203 is patterned over the same dummy gate that was patterned in the first stage such that at least one opening 1209 is formed. Alignment of the opening 1209 is less critical than in the first stage because the dielectric material 1102 cap protects the first portion 103 of the final metal gates.

FIG. 13A is a top view after removing the second stage of dummy gate material 202 to form second trenches 1301. FIG. 13B is a cross-sectional side view through the X-X' axis of FIG. 13A. FIG. 13C is a cross-sectional side view through the Y-Y' axis of FIG. 13A. Unlike the first trenches 909 formed in FIGS. 9A-9C, the second trenches 1301 are not over etched through the oxide layer 102. Instead the dummy gate material 202 is removed down to the level of the oxide layer 102, stopping on the oxide layer 102. The second trenches 1301 thus extend from a top surface of the oxide layer 102. A bottom surface of the second trenches 1301 are arranged over a bottom surface of the first trenches 909 (see FIG. 9B). The second trenches 1301 are arranged between the fins 100 of the plurality of fins and alternate with the first trenches 909.

FIG. 14A is a top view after filling the second trenches 1301 with metals and removing the mask 1203 to form the second portions 1430 of the final metal gates. FIG. 14B is a cross-sectional side view through the X-X' axis of FIG. 14A. FIG. 14C is a cross-sectional side view through the Y-Y' axis of FIG. 14A. The second portion 1430 of the final independent metal gates include one or more dielectric layers 1404 and a gate stack 1403 that includes one or more work function metals and gate metals. The gate dielectric layer(s) 1404 and the gate stack 1403 can include one or more of the materials described above for the first portion 1030 of the final independent metal gates.

FIG. 15A is a top view after recessing the metal fill of the gate stack 1404 and depositing a dielectric material 1505. FIG. 15B is a cross-sectional side view through the X-X' axis of FIG. 15A. FIG. 15C is a cross-sectional side view through the Y-Y' axis of FIG. 15A. The gate stack 1508 can be recessed by etching. The dielectric material 1505 can be, for example, the dielectric material 1102 described above. After depositing the dielectric material 1505, a planarization process, such as CMP, is performed.

As shown, first portions 1030 and second portions 1430 of the final independent metal gates are formed. The first portions 1030 and the second portions 1430 will function as independent gates, with one above the final device and one below the final device, depending on the orientation. Contacts will be formed to the first portions 1030, below the gate structures, and the second portions 1430, above the gate structures (see embodiments shown in FIGS. 21A-23C).

FIG. 16A is a top view after patterning a gate contact to connect the first portions 1030 of the gate. FIG. 16B is a cross-sectional side view through the X-X' axis of FIG. 16A. FIG. 16C is a cross-sectional side view through the Y-Y' axis of FIG. 16A. A trench is etched over the metal gate stacks of the first portions 1030 and the second portions 1430. Etching is performed to remove a portion of dielectric layers 1102, 1505 (see FIG. 15B). Because first portions 1030 of the final gate sit lower than second portions 1430, the dielectric layers 1102, 1505, do not sit at the same height. Therefore, when a dielectric etch is performed, some of dielectric layer 1102 remains after etching. All or substantially all of the dielectric layers 1505 is removed.

FIG. 17A is a top view after filling the gate contact with metal(s) 1707. FIG. 17B is a cross-sectional side view through the X-X' axis of FIG. 17A. FIG. 17C is a cross-sectional side view through the Y-Y' axis of FIG. 17A. One or more metal layers can be deposited to connect the second portions 1430 as shown. The one or more metal layers are deposited on the dielectric material 1102 of the first portions 1030. The metal(s) can be the same as or different than the metals used in the first portions 1030 and the second portions 1430 described above. The resulting metal contact including metal(s) 1707 connect the second portions 1430 of the gates and is arranged over the dielectric caps of the first portions 1030. The dielectric caps of the first portions 1030 (including dielectric material 1102) isolate the first portions 1030 from the second portions 1430 so that the first portions 1030 can function independently of the second portions.

FIG. 18A is a top view after recessing the gate contact filling and forming a dielectric gate cap 1808. FIG. 18B is a cross-sectional side view through the X-X' axis of FIG. 18A. FIG. 18C is a cross-sectional side view through the Y-Y' axis of FIG. 18A. The gate contact filling (metal(s)

1707) can be recessed by etching, and then a dielectric material is deposited on the recessed metals to form the dielectric cap 1808. The dielectric material can be, but is not limited silicon nitride (SiN), SiOCN, or SiBCN.

FIG. 19A is a top view after patterning the source/drain contacts. FIG. 19B is a cross-sectional side view through the X-X' axis of FIG. 19A. FIG. 19C is a cross-sectional side view through the Y-Y' axis of FIG. 19A. An oxide layer 1909 is deposited on the substrate and patterned over the source/drains 405 to form openings over the source/drains 405. Non-limiting examples of materials for the oxide layer 1909 include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

FIG. 20A is a top view after filling the source/drain contact trenches (openings) with contact metal(s) 2000. FIG. 20B is a cross-sectional side view through the X-X' axis of FIG. 20A. FIG. 20C is a cross-sectional side view through the Y-Y' axis of FIG. 20A. The contact metal(s) 2000 can include a liner layer, which can include a low contact resistance material, conductive liner material, or alloy. Non-limiting examples of suitable low contact resistance materials include titanium, titanium nitride, tantalum, tantalum nitride, tungsten, niobium, cobalt, cobalt titanium, nickel, platinum, or any combination thereof. One or more conductive metals are then deposited on the liner. The conductive metal can be, but is not limited to, aluminum (Al), platinum (Pt), gold (Au), tungsten (W), titanium (Ti), or any combination thereof. A planarization process, for example, CMP, is then performed.

The resulting devices shown in FIGS. 20A-20C provide a gate with alternating first and second gate portions beneath a protective dielectric cap 1808 on a top surface of the gate. The first portions 1030 are arranged below the second portions, with the first portions contacting the substrate 101 and extending through the oxide layer 102. The second portions 1430 extend from a top surface of the oxide layer 102 to the dielectric cap 1808 and are connected by a layer of metal beneath the dielectric cap. After forming the structures shown in FIGS. 20A-20C, several methods can be used to integrate the dual independent gate structure with additional metal layers to form contacts above and below the device. FIGS. 21A-21C, FIGS. 22A and 22B, and FIGS. 23A-23C illustrate various methods. However, embodiments are not limited to these examples.

Figure 21B:
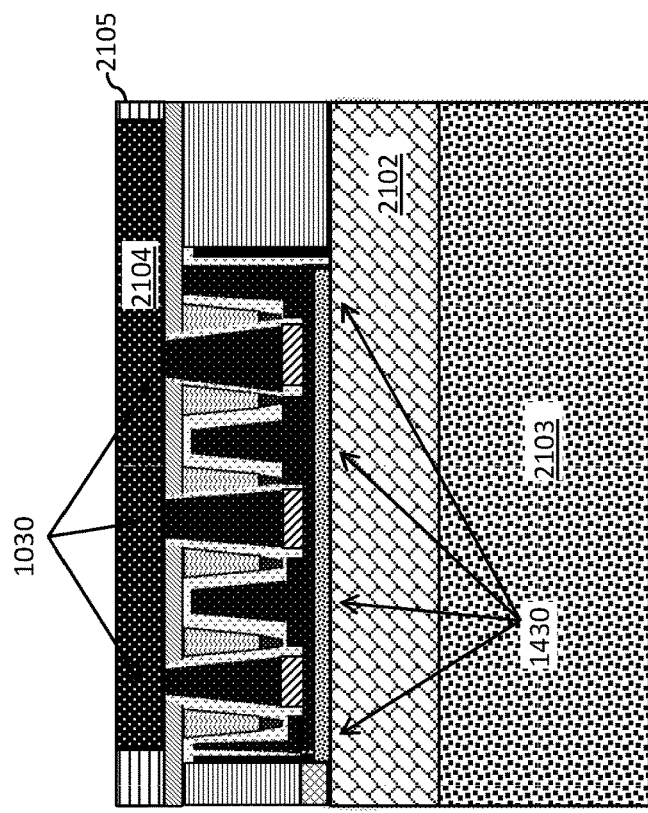
Figure 21A:
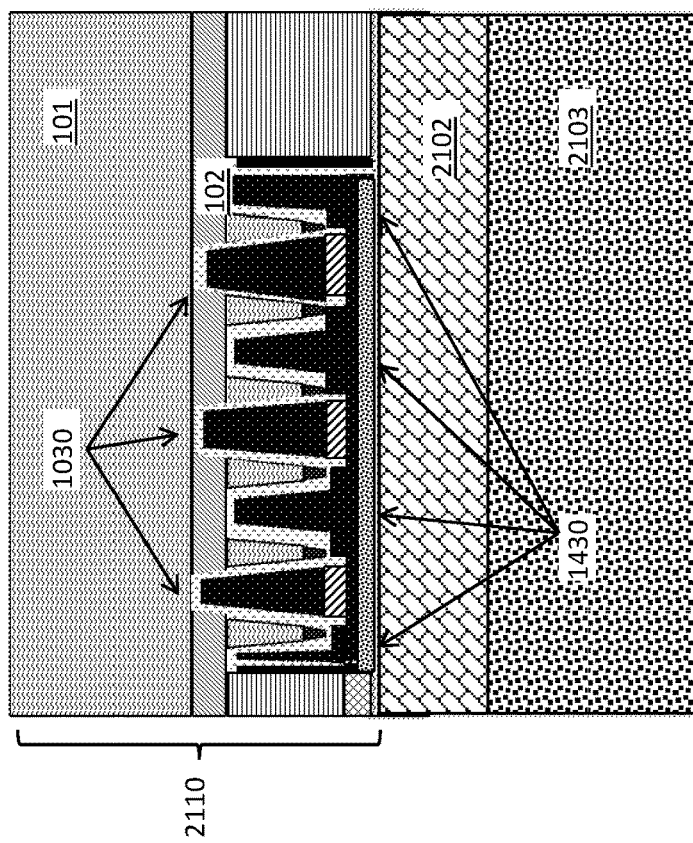

FIG. 21A-21D illustrate methods for combining the structure of FIG. 20B with another metal layer to form contacts according to one or more embodiments. FIG. 21A is a cross-sectional side view after flipping the structure shown in FIG. 20B (device 2110) upside down and bonding to a substrate 2103. After flipping the device 2110, first portions 1030 of the final gate extend over the second portions 1430. A temporary bonding film 2102 can be applied between the substrate 2103 and the device 2110.

FIG. 21B is a cross-sectional side view after forming another metal layer 2104 to the back side of the device. The original substrate 101 is removed, and a second metal layer 2104 is formed to connect first portions 1030 of the gate. The second metal layer 2104 includes one or more conductive metals and is formed within a dielectric layer 2105.

Figures 21C, 21D:
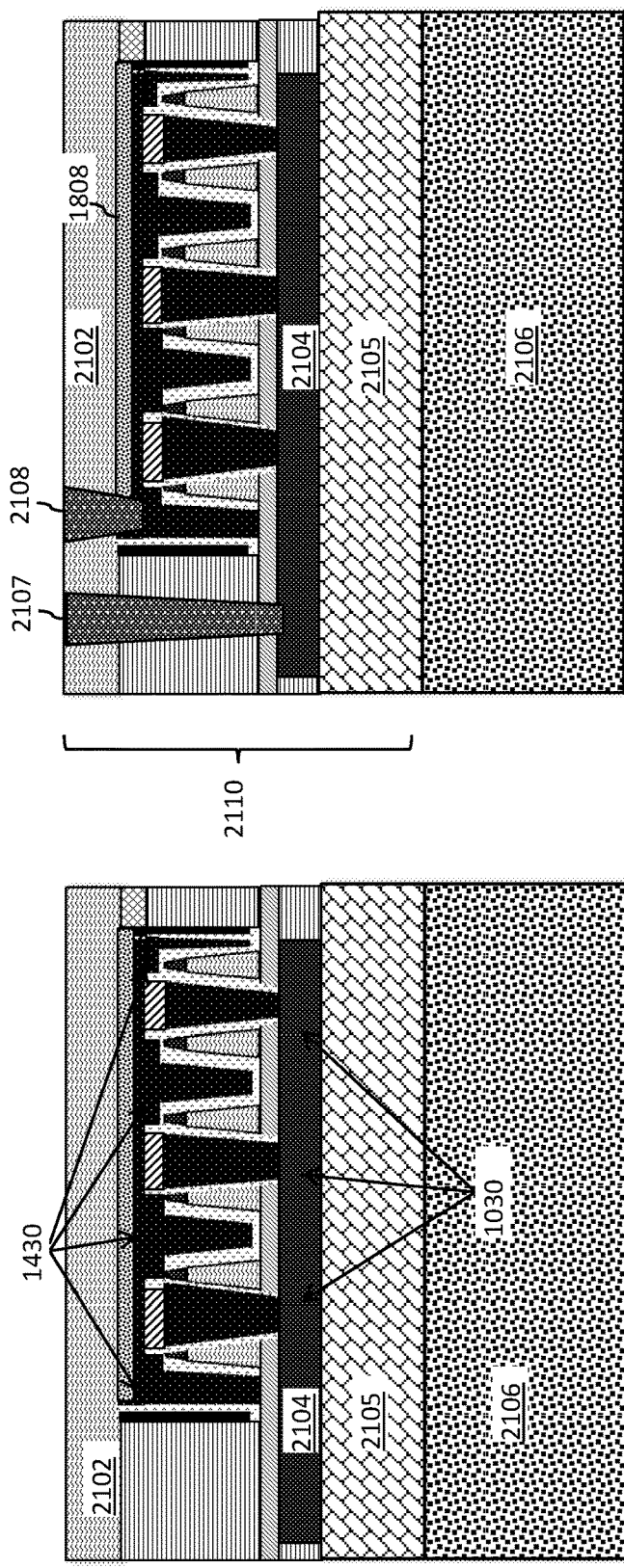

FIG. 21C is a cross-sectional side view after flipping the device upside down again and bonding to another substrate 2106 and temporary (or permanent) bonding film 2105. FIG. 21D is a cross-sectional side view after forming contacts to both gates. A first contact 2107 connects to the metal layer 2104, and a second contact 2108 connects to second portions 1430 of the gate. The second contact 2108 above the gate is shorter than the first contact 2107 below the gate. The metal layer 2104 contacts and connects bottom surfaces of first portions 1030 of the gate. The first contact 2107 is arranged adjacent to the gate. The second contact 2108 extends through the dielectric cap 1808 on the gate.

Figure 22B:
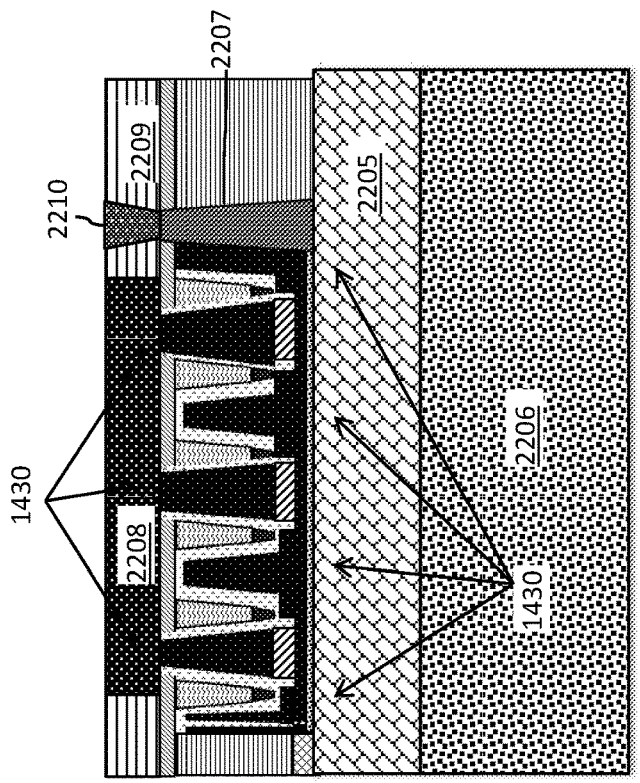
Figure 22A:
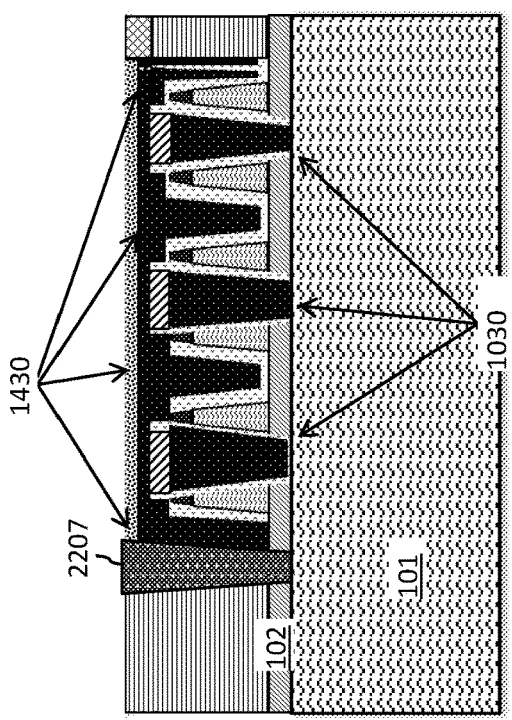

FIGS. 22A and 22B illustrate methods for combining the structure of FIG. 20B with another metal layer level to form contacts according to one or more embodiments. FIG. 22A is a cross-sectional side view after forming a first contact 2207 through the oxide layer 102. FIG. 22B is a cross-sectional side view after flipping the device and forming a second metal layer 2208 in a dielectric layer 2209. The second metal layer 2208 connects top surfaces of second portions 1430 of the gate. The device can be bonded to a substrate 2206 and a temporary (or permanent) bonding film 2205. The first contact 2207 is also extended through the dielectric layer 2209.

Figure 23B:
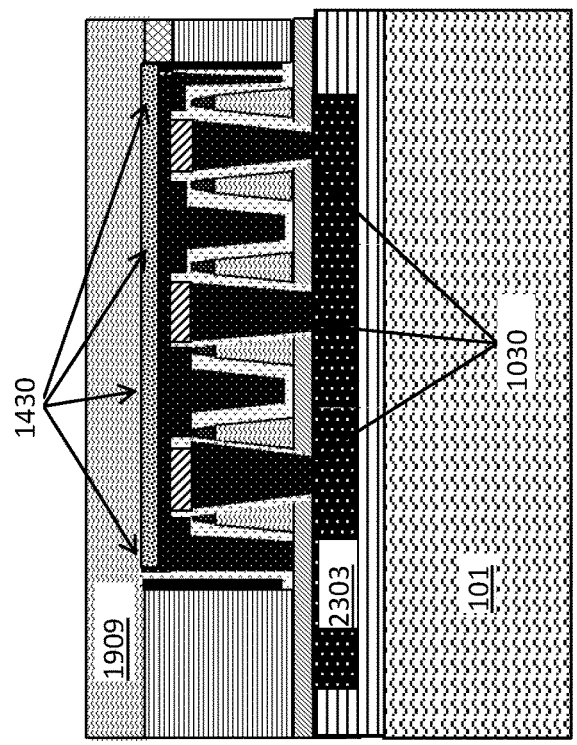
Figure 23A:
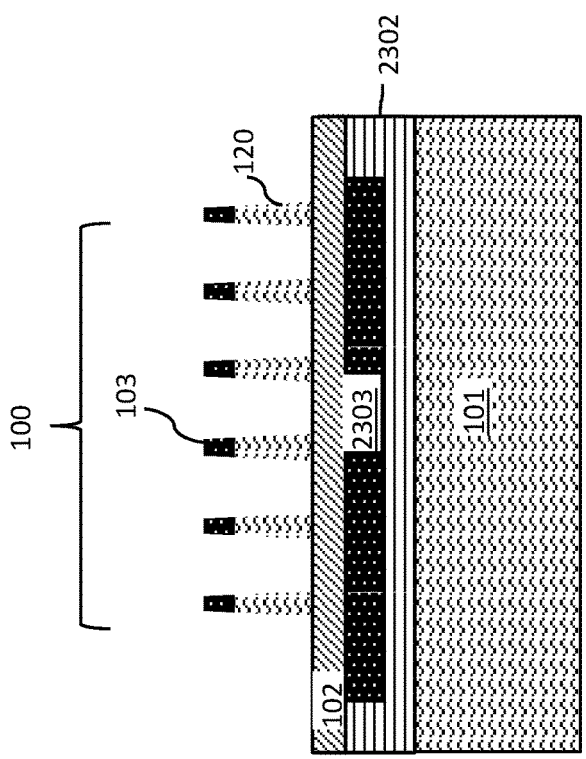
Figure 23C:
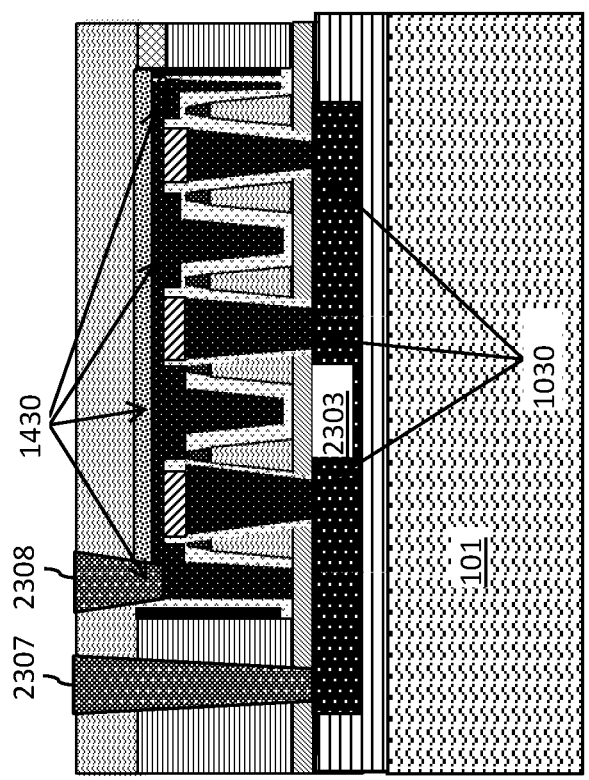

FIGS. 23A-23C illustrate methods for forming a device according to one or more embodiments. FIG. 23A is a cross-sectional side view of an initial structure in which a metal layer 2303 is formed before patterning fins 100 (combining a metal layer 2303 with FIG. 1B). In these embodiments, a metal layer 2303 in a dielectric layer 2302 is combined with patterned fins 100. The process flows described above in FIGS. 2A-20C are then performed. FIG. 23B is a cross-sectional side view after following the processing in FIGS. 2A-20C. FIG. 23C is a cross-sectional side view after forming contacts. First contact 2307 extends to the metal layer 2303, and second contact extends to the second portions 1430 of the dual gate structure. In contrast to the embodiments shown in FIGS. 21A-22B, no flipping of the device is needed. The metal layer 2303 can be formed first and a new device layer can be deposited, grown, or transferred on top of the metal layer 2303.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of making a semiconductor device, the method comprising:
   forming a plurality of fins on a substrate, the substrate comprising an oxide layer arranged beneath the plurality of fins;
   depositing a sacrificial gate material on and around the plurality of fins;
   forming first trenches in the sacrificial gate material, the first trenches extending through the oxide layer to a top surface of the substrate and being arranged between fins of the plurality of fins;
   filling the first trenches with a metal gate stack;
   recessing the metal gate stacks of the first trenches;
   depositing a dielectric material on a recessed portion of the metal gate stacks;
   forming second trenches, subsequent to depositing the dielectric material, in the sacrificial gate material, a bottom surface of the second trenches being arranged over a bottom surface of the first trenches, the second trenches being arranged between fins of the plurality of fins and alternating with the first trenches; and filling the second trenches with a metal gate stack.

2. The method of claim 1 further comprising recessing the metal gate stacks of the second trenches and depositing a dielectric material on a recessed portion of the metal gate stack.

3. The method of claim 2, wherein the dielectric material on the recessed portions of the first metal gate stacks is arranged below the dielectric material on the recessed portions of the second metal gate stacks.

4. The method of claim 3 further comprising etching a trench over the metal gate stacks of the first trenches and the second trenches by removing the dielectric material on the recessed portion of the second metal gate stack and removing a portion of the dielectric material on the recessed portion of the first metal gate stack.

5. The method of claim 4 further comprising depositing a metal in the trench to connect the metal gate stacks of the second trenches.

6. The method of claim 1 further comprising forming dielectric caps on the metal gate stacks of the first trenches.

7. The method of claim 6 further comprising connecting the metal gate stacks of the second trenches with a metal layer arranged on the dielectric caps of the first trenches.

8. A method of making a semiconductor device, the method comprising:

forming a plurality of fins on a substrate, the substrate comprising an oxide layer arranged on the substrate beneath the plurality of fins;

depositing a sacrificial gate material on and around the plurality of fins;

forming first trenches in the sacrificial gate material, the first trenches extending through the oxide layer to a top surface of the substrate and being arranged between fins of the plurality of fins;

filling the first trenches with a metal gate stack;

forming second trenches in the sacrificial gate material, a bottom surface of the second trenches being arranged over a bottom surface of the first trenches, the second trenches being arranged between fins of the plurality of fins and alternating with the first trenches;

filling the second trenches with a metal gate stack;

recessing the metal gate stacks of the first trenches and depositing a dielectric material on a recessed region of the metal gate stack of the first trenches; and depositing a metal on the metal gate stacks of the second trenches and the dielectric material of the first trenches to connect the metal gate stacks of the second trenches, the metal gate stacks of the first trenches being isolated from the metal gate stacks of the second trenches by the dielectric material.

9. The method of claim 8 further comprising depositing a dielectric material on the metal gate stacks of the second trenches to form a protective dielectric cap.

10. The method of claim 9 further comprising connecting the metal gate stacks of the first trenches with a metal layer.

11. The method of claim 10 further comprising forming a first contact through a dielectric layer to the metal layer connected to the metal gate stacks of the first trenches.

12. The method of claim 11 further comprising forming a second contact to the metal gate stacks of the second trenches.

13. The method of claim 12, wherein the second contact is shorter than the first contact.

\* \* \* \* \*